US010741699B2

(12) United States Patent
Ema et al.

(10) Patent No.: US 10,741,699 B2
(45) Date of Patent: Aug. 11, 2020

(54) SEMICONDUCTOR DEVICE

(71) Applicant: UNITED SEMICONDUCTOR JAPAN CO., LTD., Kuwana-Shi, Mie (JP)

(72) Inventors: Taiji Ema, Inabe (JP); Makoto Yasuda, Kuwana (JP)

(73) Assignee: UNITED SEMICONDUCTOR JAPAN CO., LTD., Kuwana-shi, Mie (JP)

( * ) Notice: Subject to any disclaimer, the term of this patent is extended or adjusted under 35 U.S.C. 154(b) by 0 days.

(21) Appl. No.: 16/273,534

(22) Filed: Feb. 12, 2019

(65) Prior Publication Data

US 2019/0363195 A1    Nov. 28, 2019

(30) Foreign Application Priority Data

May 25, 2018    (JP) .................. 2018-100851

(51) Int. Cl.
*H01L 29/792*    (2006.01)
*H01L 27/06*    (2006.01)

(52) U.S. Cl.
CPC ........ *H01L 29/792* (2013.01); *H01L 27/0629* (2013.01)

(58) Field of Classification Search
CPC ............... H01L 29/792; H01L 27/0629; H01L 27/11573

(Continued)

(56) References Cited

U.S. PATENT DOCUMENTS 5,838,041 A    11/1998 Sakagami et al.
6,004,849 A    12/1999 Gardner et al.
(Continued)

FOREIGN PATENT DOCUMENTS

JP    09-97849 A    4/1997
JP    2003-303904 A    10/2003
(Continued)

OTHER PUBLICATIONS

Nair et al., "Drain Disturb During CHISEL Programming of NOR Flash EEPROMs—Physical Mechanisms and Impact of Technological Parameters", IEEE Transactions on Electron Devices, May 2004, vol. 51, No. 5, pp. 701-707 (7 pages).

(Continued)

*Primary Examiner* — Fernando L Toledo
*Assistant Examiner* — Adam S Bowen
(74) *Attorney, Agent, or Firm* — Westerman, Hattori, Daniels & Adrian, LLP

(57) ABSTRACT

A semiconductor device includes a gate insulator layer above a semiconductor substrate, a gate electrode above the gate insulating layer, a sidewall insulator layer on sidewalls of the gate electrode and above the substrate, source and drain regions within the substrate on both sides of the gate electrode, a first region within the substrate below a part of the sidewall insulator layer closer to the source region and having an impurity concentration lower than the source region, a second region provided within the substrate below a part of the sidewall insulator layer closer to the drain region and having an impurity concentration lower than the drain region, a channel region provided within the substrate between the first and second regions, and a third region within the substrate below the channel region and including impurities of a different type and having an impurity concentration higher than the channel region.

14 Claims, 20 Drawing Sheets

(58) Field of Classification Search
USPC .......................................................... 257/314
See application file for complete search history.

(56) References Cited

U.S. PATENT DOCUMENTS

| | | |
|---|---|---|
| 8,163,619 B2 | 4/2012 | Yang et al. |
| 9,196,727 B2 | 11/2015 | Thompson et al. |
| 2003/0185052 A1 | 10/2003 | Yeh et al. |
| 2003/0222303 A1 | 12/2003 | Fukuda et al. |
| 2005/0224859 A1 | 10/2005 | Iwata et al. |
| 2007/0108470 A1 | 5/2007 | Wang et al. |
| 2007/0108507 A1 | 5/2007 | Wang et al. |
| 2007/0108508 A1 | 5/2007 | Lin et al. |
| 2007/0109860 A1 | 5/2007 | Lin et al. |
| 2007/0109861 A1 | 5/2007 | Wang et al. |
| 2007/0109869 A1 | 5/2007 | Wang et al. |
| 2007/0109872 A1 | 5/2007 | Lin et al. |
| 2007/0111357 A1 | 5/2007 | Wang et al. |
| 2008/0138956 A1 | 6/2008 | Wang et al. |
| 2008/0237730 A1 | 10/2008 | Saeki et al. |
| 2008/0293199 A1 | 11/2008 | Lin et al. |
| 2014/0248753 A1 | 9/2014 | Shifren et al. |
| 2015/0021732 A1* | 1/2015 | Kanai ................ H01L 27/0629 257/476 |
| 2015/0200191 A1* | 7/2015 | Matsuura ........... H01L 27/0629 257/316 |
| 2016/0284720 A1* | 9/2016 | Ema ...................... H01L 23/528 |
| 2017/0309561 A1 | 10/2017 | Ema et al. |
| 2019/0363195 A1 | 11/2019 | Ema et al. |

FOREIGN PATENT DOCUMENTS

| | | |
|---|---|---|
| JP | 2003-332474 A | 11/2003 |
| JP | 2004-056095 A | 2/2004 |
| JP | 2007-142398 A | 6/2007 |
| JP | 2016-184721 A | 10/2016 |

OTHER PUBLICATIONS

Arbat et al., "SkyFlash EC Project: Architecture for a 1Mbit S-Flash for Space Applications", ICECS 2012 (Conference on Dec. 9-Dec. 12, 2012), IEEE, pp. 617-620 (4 pages).

Non-Final Office Action dated Jan. 6, 2020, issued in counterpart U.S. Appl. No. 16/201,584 (25 pages).

Fujita, K. et al., "Advanced Channel Engineering Achieving Aggressive Reduction of VT Variation for Ultra-Low-Power Applications", IEEE, 2011, pp. 749-752.

Clark, L.T. et al., "A Highly Integrated 65-nm SoC Process with Enhanced Power/Performance of Digital and Analog Circuits", IEEE, 2012, pp. 335-338.

Patel, Harsh N. et al., "A 55nm Ultra Low Leakage Deeply Depleted Channel Technology Optimized for Energy Minimization in Sub-threshold SRAM and Logic" IEEE, 2016, pp. 37-40.

Zeng, Yu et al., "A 1.7nW PLL-Assisted Current Injected 32KHz Crystal Oscillator for IoT", Symposium on VLSI Circuits, 2017, pp. 68-69.

Hori, M. et al., "Embedded FLOTOX Flash on Ultra-Low Power 55nm Logic DDC Platform", IEEE, 2013, pp. 244-247.

Fukuda, Masatoshi et al., "Scaled 2 bit/cell SONOS Type Nonvolatile Memory Technology for sub-90nm Embedded Application using SiN Sidewall Trapping Structure", IEEE, 2003, pp. 909-912.

Final Office Action dated Jun. 5, 2020, issued in U.S. Appl. No. 16/201,584 (20 pages).

\* cited by examiner

SEMICONDUCTOR DEVICE

CROSS-REFERENCE TO RELATED APPLICATIONS

This application is based upon and claims the benefit of priority of the prior Japanese Patent Application No. 2018-100851, filed on May 25, 2018, the entire contents of which are incorporated herein by reference.

FIELD

The embodiments discussed herein are related to a semiconductor device.

BACKGROUND

A nonvolatile memory is one example of the semiconductor device. For example, a known nonvolatile memory includes, as a memory transistor, a MOS (Metal Oxide Semiconductor) field effect transistor that stores information by accumulating a charge (hot carrier) in a sidewall insulator layer of a gate electrode sidewall.

In the nonvolatile memory including a group of memory transistors that store the information by accumulating the hot carrier in the sidewall insulator layer, a programming speed of the entire nonvolatile memory depends on programming speeds of the individual memory transistors. If the programming speeds of the individual memory transistors are not sufficiently high, it may not be possible to perform, within a tolerable time, a predetermined programming in a system that includes the nonvolatile memory, depending on a capacity of the nonvolatile memory.

Accordingly, a semiconductor device designed to improve the programming speed of the memory transistor is proposed in Japanese Laid-Open Patent Publication No. 2016-184721, for example. This proposed semiconductor device can improve the programming speed of the memory transistor.

On the other hand, there recently are increased demands to further reduce a power consumption of the semiconductor device.

SUMMARY

Accordingly, it is an object in one aspect of the embodiments to provide a semiconductor device that can further reduce the power consumption.

According to one aspect of the embodiments, a semiconductor device includes a gate insulator layer provided above a semiconductor substrate; a gate electrode provided above the gate insulating layer; a sidewall insulator layer provided on sidewalls of the gate electrode and above the semiconductor substrate; a source region and a drain region respectively provided within the semiconductor substrate on both sides of the gate electrode, and including impurities of a first conductivity type; a first semiconductor region provided within the semiconductor substrate at a position below a first part of the sidewall insulator layer closer to the source region than the gate electrode, and including impurities of the first conductivity type having an impurity concentration lower than that of the source region; a second semiconductor region provided within the semiconductor substrate at a position below a second part of the sidewall insulator layer closer to the drain region than the gate electrode, and including impurities of the first conductivity type having an impurity concentration lower than that of the drain region; a channel region provided within the semiconductor substrate between the first semiconductor region and the second semiconductor region; and a third semiconductor region provided within the semiconductor substrate below the channel region, and including impurities of a second conductivity type different from the first conductivity type and having an impurity concentration higher than that of the channel region, wherein information is stored by injecting a charge into the sidewall insulator layer, wherein, when injecting the charge into the sidewall insulator layer, the semiconductor substrate is grounded, a first voltage higher than a ground potential is applied to the gate electrode, a second voltage higher than the ground potential is applied to the drain region, and a third voltage higher than the ground potential and lower than the first voltage and the second voltage is applied to the source region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of the semiconductor device in each embodiment according to the present invention.

First Embodiment

Figure 1:
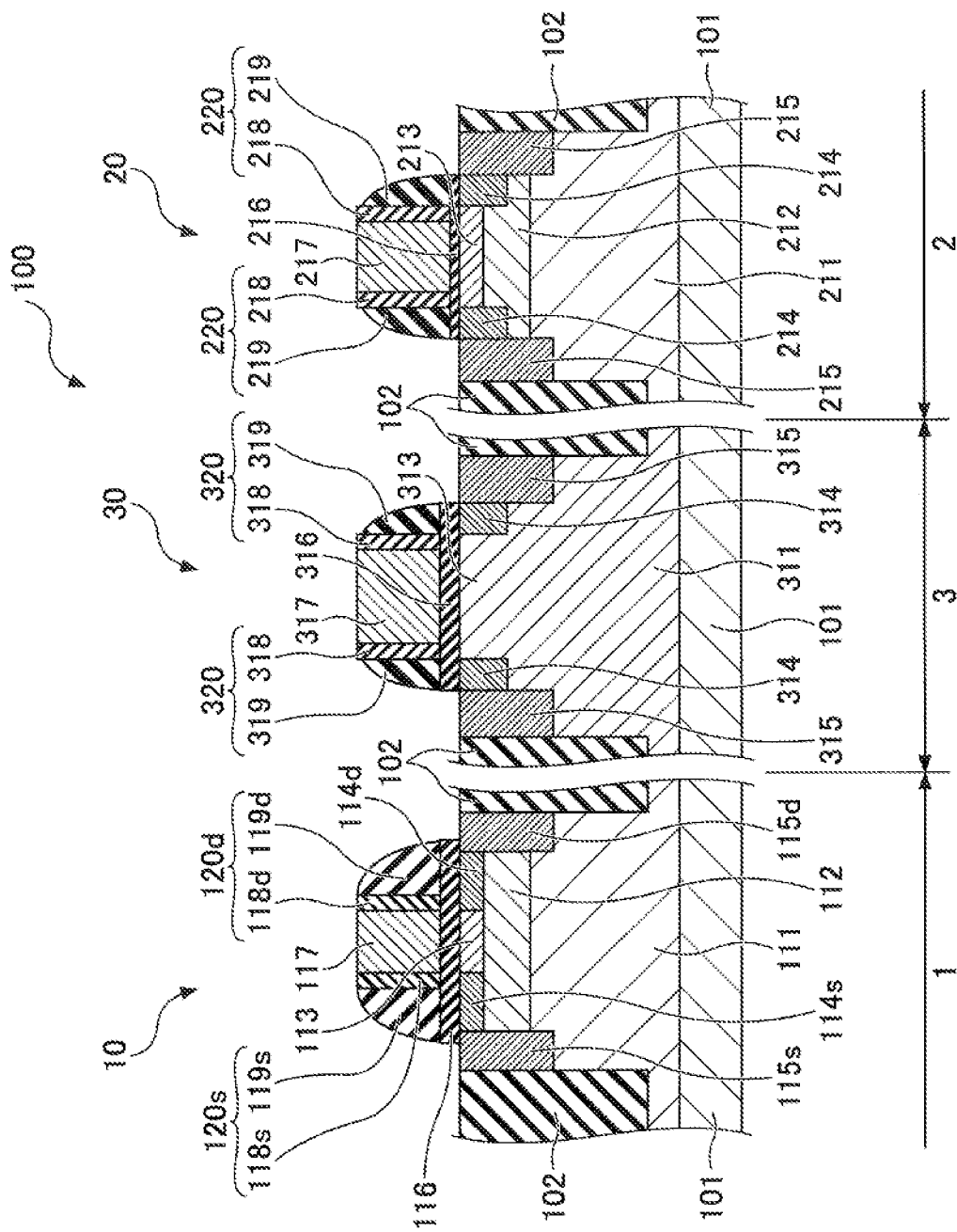
FIG. 1 is a cross sectional view illustrating a semiconductor device in a first embodiment.

First, a first embodiment will be described. FIG. 1 is a cross sectional view illustrating the semiconductor device in the first embodiment.

A semiconductor device 100 in the first embodiment is an example of a nonvolatile memory, and includes a transistor (memory transistor) 10 provided in a memory region 1, a transistor (logic transistor) 20 provided in a logic region 2, and a transistor (I/O transistor) 30 provided in an input and output (I/O) region 3. The memory transistor 10, the logic transistor 20, and the I/O transistor 30 are formed on a common p-type semiconductor substrate 101. Various kinds of semiconductor substrates, including a silicon (Si) substrate, a silicon germanium (SiGe) substrate, or the like, may be used for the semiconductor substrate 101. A region (element region) in which the memory transistor 10 is formed, a region (element region) in which the logic transistor 20 is formed, and a region (element region) in which the I/O transistor 30 is formed, are isolated by element isolation regions 102 that are formed in the semiconductor substrate using STI (Shallow Trench Isolation), thermal oxidation, or the like.

One memory transistor 10 is illustrated in the example illustrated in FIG. 1, however, a plurality of memory transistors 10, or at least one memory transistor 10 and other memory transistors, may be included in the memory region 1 of the semiconductor device 100. One logic transistor 20 is illustrated in the example illustrated in FIG. 1, however, a plurality of logic transistors 20, or at least one logic transistor 20 and other logic transistors, may be included in the logic region 2 of the semiconductor device 100. One I/O transistor 30 is illustrated in the example illustrated in FIG. 1, however, a plurality of I/O transistors 30, or at least one I/O transistor 30 and other I/O transistors, may be included in the I/O region 3 of the semiconductor device 100.

In the memory region 1, a p-type well 111 is formed at the surface of the semiconductor substrate 101. The memory transistor 10 includes a gate insulator layer 116 provided above the semiconductor substrate 101, a gate electrode 117 provided above the gate insulator layer 116, and a sidewall insulator layers 120s and 120d provided on side walls of the gate electrode 117 and above the semiconductor substrate 101. The memory transistor 10 further includes an n-type source region 115s and a drain region 115d respectively provided within the semiconductor substrate 101 on both sides (both sides along a gate length direction) of the gate electrode 117. The memory transistor 10 includes a first semiconductor region 114s within the semiconductor substrate 101, provided below the sidewall insulator layer 120s.

The first semiconductor region 114s includes n-type impurities having a concentration lower than that of the source region 115s. The memory transistor 10 includes a second semiconductor region 114d within the semiconductor substrate 101, provided below the sidewall insulator layer 120d. The second semiconductor region 114d includes n-type impurities having a concentration lower than that of the drain region 115d. The first semiconductor region 114s is an LDD (Lightly Doped Drain) region, for example, and the second semiconductor region 114d is a non-doped region, for example. The second semiconductor region 114d may be an LDD region.

Various kinds of insulator materials, such as silicon oxides (for example, $SiO_2$), silicon nitrides (for example, $Si_3N_4$), hafnium oxides (for example, $HfO_2$), or the like, may be used for the gate insulator layer 116. A thickness of the gate insulator layer 116 is set based on a threshold voltage that is set with respect to the memory transistor 10, for example.

In addition to polycrystalline silicon (polysilicon), metals, such as titanium (Ti), tungsten (W), or the like, and nitrides of such metals, may be used for the gate electrode 117.

The sidewall insulator layer 120s includes a structure in which an oxide layer 118s and a nitride layer 119s, that are insulator layers, are stacked, for example. The sidewall insulator layer 120d includes a structure in which an oxide layer 118d and a nitride layer 119d, that are insulator layers, are stacked, for example. For example, silicon oxides are used for the oxide layers 118s and 118d. For example, silicon nitrides are used for the nitride layers 119s and 119d. For example, the gate insulator layer 116 extends as it is on the semiconductor substrate 101, and an oxide layer is formed on a side surface of the gate electrode 117 by thermally oxidizing the gate electrode 117. Hence, as a whole, the oxide layers 118s and 118d and the gate insulator layer 116 are provided in an L-shape in a cross section, on the sidewalls of the gate electrode 117 and the semiconductor substrate 101, and the nitride layers 119s and 119d are provided on the oxide layers 118s and 118d and the gate insulator layer 116. FIG. 1 illustrates an example in which the sidewall insulator layer 120s has a 2-layer structure formed by the oxide layer 118s and the nitride layer 119s, and the sidewall insulator layer 120d has a 2-layer structure formed by the oxide layer 118d and the nitride layer 119d. However, the sidewall insulator layers 120s and 120d may have a multi-layer structure having an L-shaped cross section, such as a 3-layer structure, or a layer including 4 or more layers. The sidewall insulator layers 120s and 120d may have a single-layer structure formed by an oxide layer or a nitride layer. For example, the sidewall insulator layers 120s and 120d may have a width (or thickness) W1 along the gate length direction of the gate electrode 117 (planar direction of the semiconductor substrate 101) greater than a width (or thickness) W2 of a sidewall insulator layer 220 of the logic transistor 20 which will be described later.

The source region 115s and the drain region 115d may include impurities of a predetermined conductivity type, that is, n-type impurities such as phosphorus (P), arsenic (As), or the like, having a predetermined concentration.

In the memory transistor 10, a region between the first semiconductor region 114s and the second semiconductor region 114d below the gate electrode 117 functions as a channel region 113 in which carriers (electrons or holes) move. The second semiconductor region 114d may function as a part of the channel region 113. The channel region 113 is an i-type non-doped region, for example.

The memory transistor 10 includes a third semiconductor region 112 provided below the channel region 113. The third semiconductor region 112 includes impurities having a concentration higher than that of the channel region 113. The third semiconductor region 112 is sometimes also referred to as a screen layer (SCR layer). The third semiconductor region 112 includes impurities of a conductivity type different from that included in the source region 115s and the drain region 115d, and having a predetermined concentration. A threshold voltage of the memory transistor 10 is controlled by the impurity concentration of the third semiconductor region 112. In addition, a punch-through between the source region 115s and the drain region 115d is suppressed by the third semiconductor region 112. The third semiconductor region 112 is provided at a position embedded inside the semiconductor substrate 101 by an amount corresponding to a thickness of the channel region from an interface between the semiconductor substrate 101 and the gate insulator layer 116, and controls the threshold voltage by the impurity concentration thereof. Hence, the third semiconductor region 112 has a relatively high impurity concentration of approximately $1 \times 10^{19}$ cm$^{-3}$. Preferably, the p-type impurity concentration of the third semiconductor region 112 is lower than the n-type impurity concentration of the first semiconductor region 114s, and is higher than the n-type impurity concentration of the second semiconductor region 114d. Further, the n-type impurity concentration of the second semiconductor region 114d is preferably 1/10 or less of the p-type impurity concentration of the third semiconductor region 112.

The memory transistor 10 is a nonvolatile memory transistor that stores information by accumulating a charge (electrons in this example) in the sidewall insulator layer 120d, and mainly accumulates the charge in the nitride layer 119d. The nitride layer 119d made of a material such as silicon nitride has a level that traps the charge, and the oxide layer 118d and the gate insulator layer 116 made of a material such as silicon oxide suppress dissipation of the charge accumulated in the nitride layer 119d.

In the logic region 2, a p-type well 211 is formed at the surface of the semiconductor substrate 101. As illustrated in FIG. 1, the logic transistor 20 includes a gate insulator layer 216 provided above the semiconductor substrate 101, a gate electrode 217 provided above the gate insulator layer 216, and the sidewall insulator layer 220 provided on side walls of the gate electrode 217 and above the semiconductor substrate 101. The logic transistor 20 further includes two impurity regions 215 respectively provided within the semiconductor substrate 101 on both sides of the gate electrode 217 (on both sides along a gate length direction) to function as a source region and a drain region. In addition, the logic transistor 20 may include LDD regions 214 within the semiconductor substrate 101 below the sidewall insulator layers 220, on inner sides of the two impurity regions 215, respectively.

Various kinds of insulator materials, such as silicon oxides, silicon nitrides, hafnium oxides, or the like, may be used for the gate insulator layer 216. A thickness of the gate insulator layer 216 is set based on a threshold voltage that is set with respect to the logic transistor 20 and is thicker than a thickness of the gate insulator layer 116, for example.

In addition to polysilicon, metals, such as titanium, or the like, and nitrides of such metals, may be used for the gate electrode 217.

The sidewall insulator layer 220 includes a structure in which an oxide layer 218 and a nitride layer 219, that are insulator layers, are stacked, for example. For example, silicon oxide is used for the oxide layer 218. For example, silicon nitride is used for the nitride layer 219. The sidewall insulator layer 220 has a stacked structure formed by the oxide layer 218 and the nitride layer 219, however, the sidewall insulator layer 220 may have a single-layer structure formed by an oxide layer or a nitride layer. For example, the sidewall insulator layer 220 may have the width W2 along the gate length direction of the gate electrode 217 (planar direction of the semiconductor substrate 101) smaller than the width W1 of each of the sidewall insulator layers 120s and 120d of the memory transistor 10.

The impurity regions 215 may include n-type impurities having a predetermined concentration. The LDD regions 214 may include impurities of the same conductivity type as the impurities included in the impurity regions 215, but the impurity concentration of the LDD regions 214 is lower than that of the impurity regions 215.

In the logic transistor 20, a region between the two LDD regions 214 below the gate electrode 217 functions as a channel region 213 in which carriers (electrons or holes) move.

The logic transistor 20 includes a semiconductor region 212 having a relatively high impurity concentration and provided below the channel region 213. The semiconductor region 212 contributes to reducing variations in the threshold voltage of the logic transistor 20, reducing the power consumption, or the like.

The logic transistor 20 in the logic region 2 is used to perform a reading (read) for the memory transistor 10 in the memory region 1, for example.

In the I/O region 3, a p-type well 311 is formed at the surface of the semiconductor substrate 101. As illustrated in FIG. 1, the I/O transistor 30 includes a gate insulator layer 316 provided above the semiconductor substrate 101, a gate electrode 317 provided above the gate insulator layer 316, and a sidewall insulator layers 320 provided on side walls of the gate electrode 317 and above the semiconductor substrate 101. The I/O transistor 30 further includes two impurity regions 315 respectively provided within the semiconductor substrate 101 on both sides (both sides along a gate length direction) of the gate electrode 317 to function as a source region and a drain region. The I/O transistor 30 may include LDD regions 314 within the semiconductor substrate 101 below the sidewall insulator layers 320, on inner sides of the two impurity regions 315, respectively.

Various kinds of insulator materials, such as silicon oxides, silicon nitrides, hafnium oxides, or the like, may be used for the gate insulator layer 316. A thickness of the gate insulator layer 316 is set based on a threshold voltage that is set with respect to the I/O transistor 30 and is equal or approximately equal to a thickness of the gate insulator layer 116, for example.

In addition to polysilicon, metals, such as titanium, or the like, and nitrides of such metals, may be used for the gate electrode 317.

The sidewall insulator layer 320 includes a structure in which an oxide layer 318 and a nitride layer 319, that are insulator layers, are stacked, for example. For example, silicon oxide is used for the oxide layer 318. For example, silicon nitride is used for the nitride layer 319. The sidewall insulator layer 320 has a stacked structure formed by the oxide layer 318 and the nitride layer 319, however, the sidewall insulator layer 320 may have a single-layer structure formed by an oxide layer or a nitride layer.

The impurity regions 315 may include n-type impurities having a predetermined concentration. The LDD regions 314 may include impurities of the same conductivity type as the impurities included in the impurity regions 315, but the impurity concentration of the LDD regions 314 is lower than that of the impurity regions 315.

In the I/O transistor 30, a region between the two LDD regions 314 below the gate electrode 317 functions as a channel region 313 in which carriers (electrons or holes) move. The I/O transistor 30 is used to perform a programming (write) or an erasing (erase) with respect to the memory transistor 10 in the memory region 1, for example.

Next, operations of the programming and the reading (read) of the memory transistor 10 will be described.

The programming operation is performed by setting each of nodes of the gate electrode 117, the source region 115s, the drain region 115d, and the semiconductor substrate 101 to a predetermined potential to generate hot carriers, and injecting and accumulating (holding) the generated hot carriers into the sidewall insulator layer 120d. The semiconductor substrate 101 is grounded, a first voltage (positive voltage) higher than a ground potential is applied to the gate electrode 117, a second voltage (positive voltage) higher than the ground potential is applied to the drain region 115d, and a third voltage (positive voltage) is applied to the source region 115s. The third voltage is higher than the ground potential, and is lower than the first voltage and the second voltage. By adjusting the potentials of the memory transistor 10 in this manner, an inversion layer (not illustrated) is formed in the channel region 113, and the electrons flow through the channel region 113 from the source region 115s toward the drain region 115d. The electrons flowing through the channel region 113 toward the drain region 115d assume a high-energy state in a vicinity of the drain region 115d due to an electric field of the second voltage applied to the drain region 115d, and thereby generate the hot electrons. The hot electrons generated in the vicinity of the drain region 115d are injected and accumulated into the sidewall insulator layer 120d by an electric field of the first voltage applied to the gate electrode 117.

The reading operation is performed by grounding the drain region 115d and the semiconductor substrate 101, and applying positive voltages to the gate electrode 117 and the source region 115s, for example. The positive voltage applied to the gate electrode 117 is set relatively high in order to obtain a large read current, and the positive voltage applied to the source region 115s is set low in order to reduce a read disturb and to reduce current consumption. In a state in which the electrons are injected into and accumulated in the sidewall insulator layer 120d, a potential with respect to the electrons of the second semiconductor region 114d becomes high, and as a result, a resistance of the second semiconductor region 114d becomes high. For this reason, a current flowing from the source region 115s to the drain region 115d decreases. On the other hand, in a state in which the electrons are not injected into and accumulated in the sidewall insulator layer 120d, the resistance of the second semiconductor region 114d does not become high, and the current flowing from the source region 115s to the drain region 115d does not decrease. Accordingly, the existence or non-existence of the electrons in the sidewall insulator layer 120d (information "0" or "1") is read by the current flowing from the source region 115s to the drain region 115d.

In a case in which the memory transistor 10 is a p-channel, the semiconductor substrate 101 is the n-type, the source region 115s, the drain region 115d, and the first semiconductor region 114s are p-type, and the second semiconductor region 114d is p-type or i-type.

In a p-channel memory transistor 10, holes are injected into and accumulated in the sidewall insulator layer 120d by applying voltages having polarities opposite to those of the voltages applied to each of the nodes at the time of the programming operation described above, for example. In addition, in the p-channel memory transistor 10, the existence or non-existence of the holes in the sidewall insulator layer 120d is read by applying voltages having polarities opposite to those of the voltages applied to each of the nodes at the time of the reading operation described above, for example.

Next, the voltages at the time of the programming operation will be described in more detail.

Figure 2A:
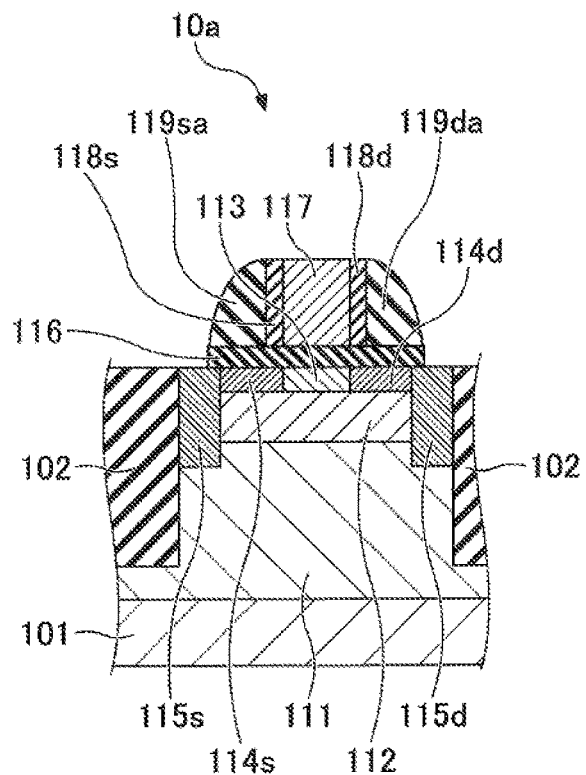
FIG. 2A and FIG. 2B are cross sectional views illustrating a pseudo memory transistor.
Figure 2B:
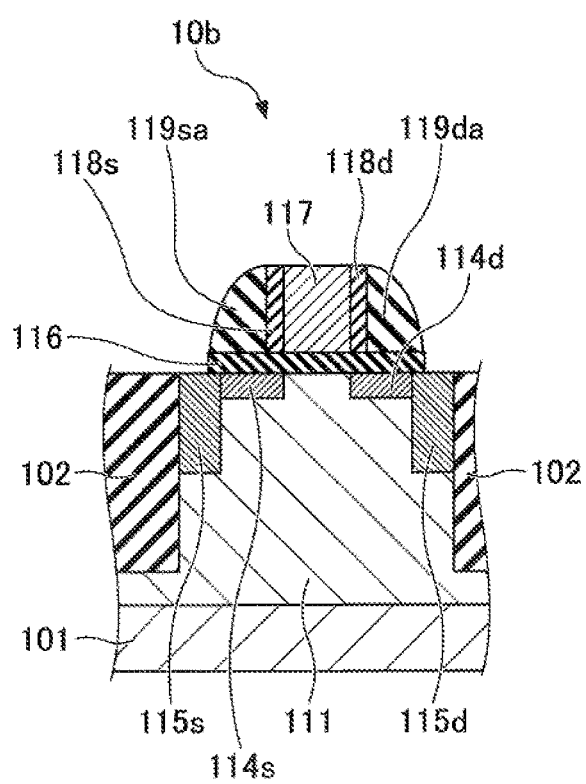

First, a description will be given of experiments conducted by the present invention regarding the body effect, relation to the voltages at the time of the programming operation. FIG. 2A is a cross sectional view illustrating a pseudo memory transistor resembling the memory transistor 10, and FIG. 2B is a cross sectional view illustrating a pseudo memory transistor of a reference example.

As illustrated in FIG. 2A, in a pseudo memory transistor 10a, oxide layers 119sa and 119da are respectively formed in place of the nitride layers 119s and 119d. Otherwise, the pseudo memory transistor 10a has a structure similar to that of the memory transistor 10. In addition, as illustrated in FIG. 2B, a pseudo memory transistor 10b of the reference example does not include the third semiconductor region 112, and the channel region 113 is included in the p-type well 111. Otherwise, the pseudo memory transistor 10b of the reference example has a structure similar to that of the pseudo memory transistor 10a.

Figure 3:
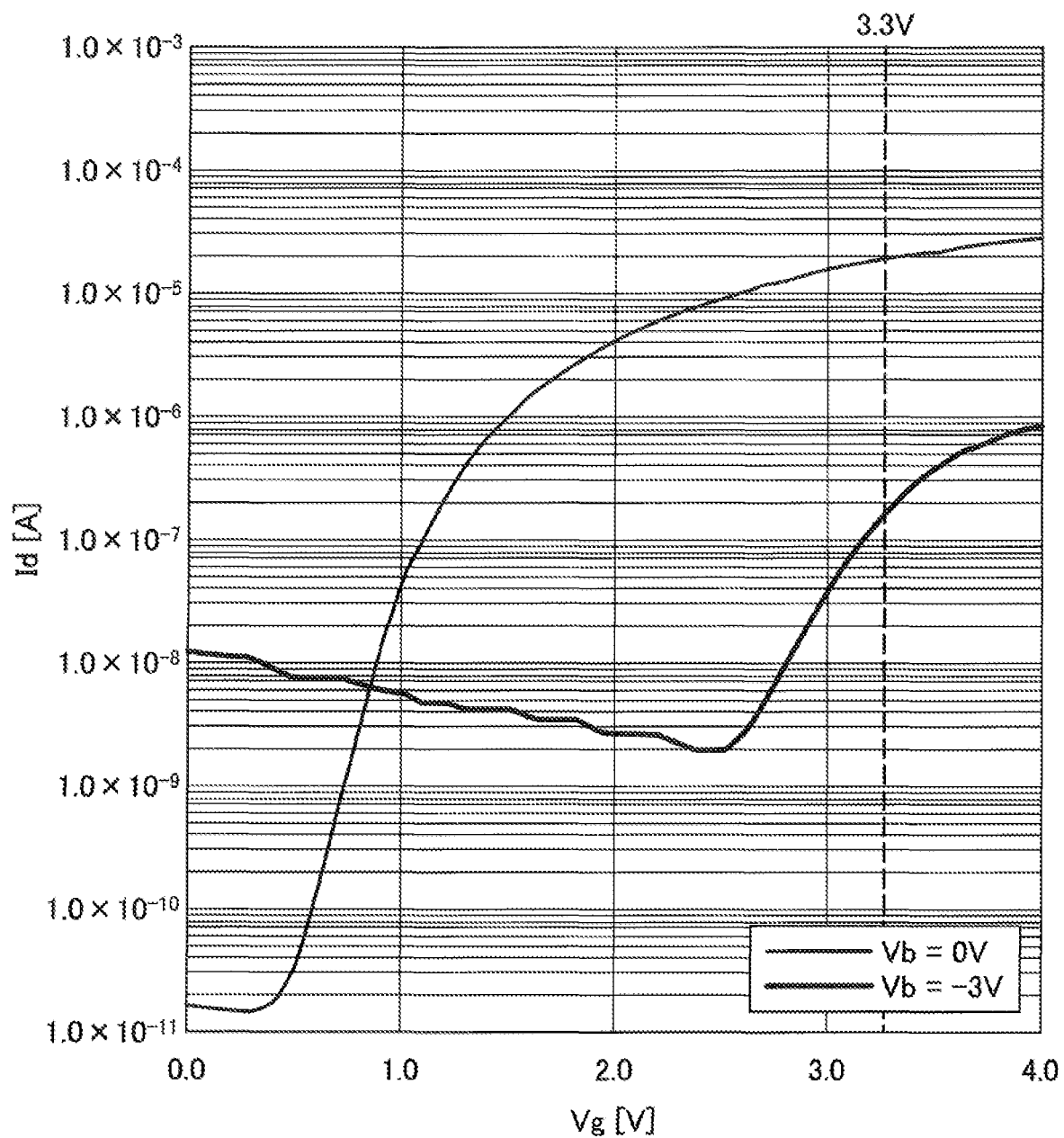
FIG. 3 is a diagram illustrating measured results of the pseudo memory transistor in the first embodiment.
Figure 4:
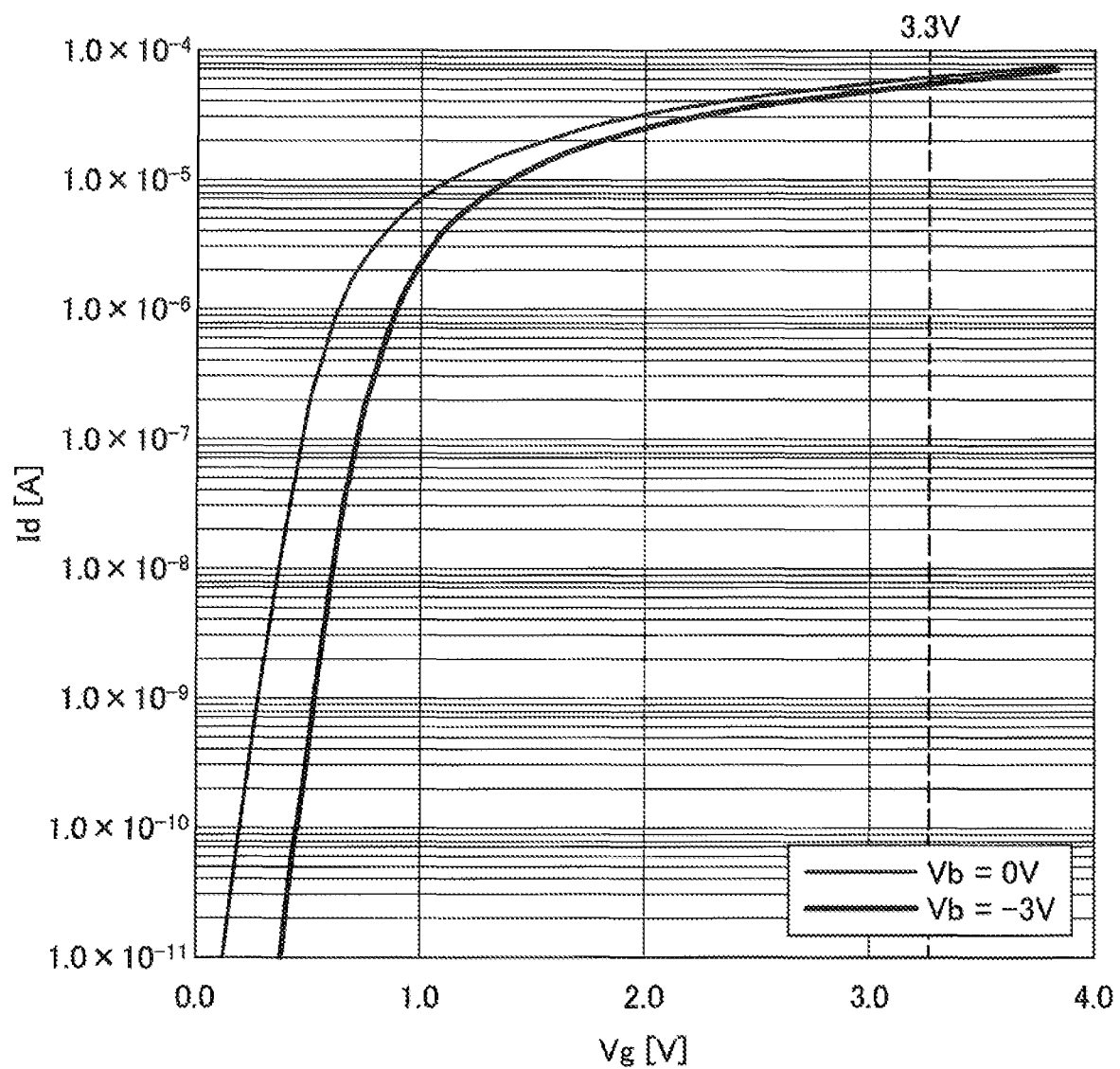
FIG. 4 is a diagram illustrating measured results of the pseudo memory transistor in a reference example.

A relationship (Id-Vg characteristic) between a drain current Id and a gate voltage Vg was studied for the pseudo memory transistors 10a and 10b. A voltage (substrate voltage) Vb of the semiconductor substrate 101 was set to 0 V or −3 V, a voltage (source voltage) Vs of the source region 115s was set to 0 V, a voltage (drain voltage) Vd of the drain region 115d was set to 3.3 V, and a sweep of the voltage (gate voltage) Vg of the gate electrode 117 was made. FIG. 3 is a diagram illustrating measured results of the pseudo memory transistor 10a, and FIG. 4 is a diagram illustrating measured results of the pseudo memory transistor 10b.

As illustrated in FIG. 3, when the gate voltage Vg at the time of the programming the pseudo memory transistor 10a is 3.3 V, and a potential Vb is set to −3 V, the drain current Id at the time of the programming (programming current) can be decreased to approximately 1/100 compared to when the potential Vbb is 0 V. This decrease in the drain current Id enables reduction in the power consumption. On the other hand, as illustrated in FIG. 4, when the gate voltage Vg at the time of the programming of the pseudo memory transistor 10b is virtually 3.3 V, even when the potential Vb is set to −3 V, the drain current Id at the time of the programming virtually does not change and virtually remains the same as when the potential Vb is 0 V.

The present inventors found through the experiments that the programming current can be effectively decreased by applying a negative voltage to the semiconductor substrate 101 of the memory transistor 10 having the third semiconductor region 112.

The reason why the oxide layers 119sa and 119da are used is because the threshold voltage changes according to the injection of the electrons when the nitride layers 119s and 119d are used, to make it impossible to measure static characteristics.

Figure 5A:
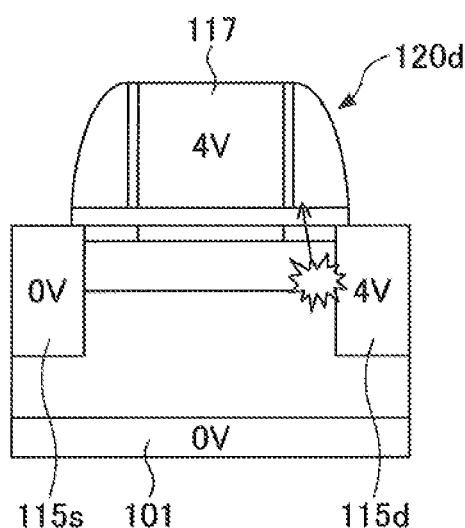
FIG. 5A, FIG. 5B, and FIG. 5C are diagrams illustrating first and second conditions of a programming operation and a condition of a reading operation.
Figure 5B:
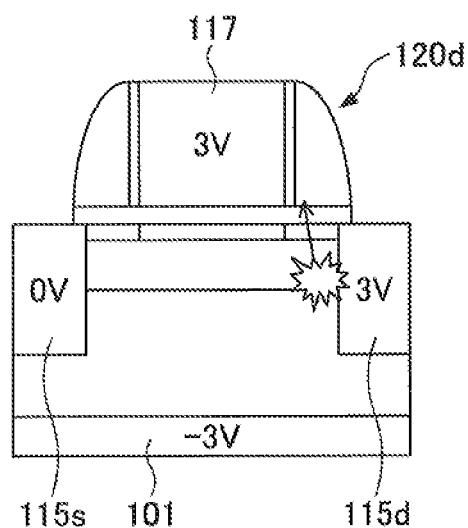
Figure 5C:
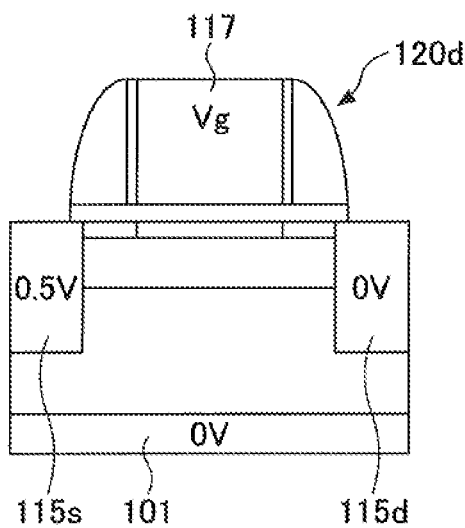

The present inventors also conducted experiments to find out an extent of decrease in the programming current due to the body effect in the memory transistor 10. FIG. 5A, is a cross sectional view a first condition of the programming, and FIG. 5B is a cross sectional view illustrating a second condition of the programming. In addition, FIG. 5C is a cross sectional view illustrating a reading condition.

Figure 6:
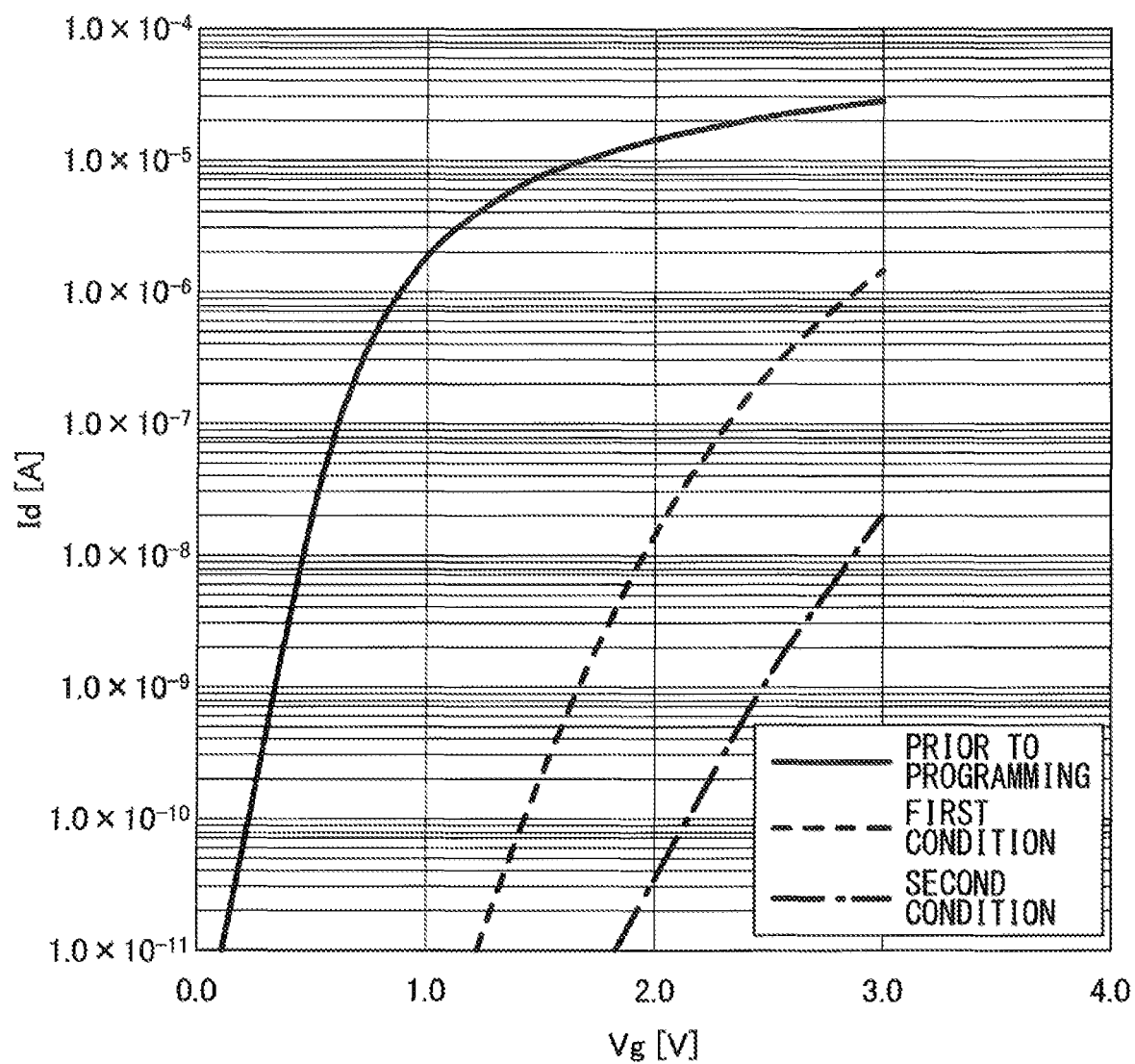
FIG. 6 is a diagram illustrating a Id-Vg characteristic before and after programming by the first and second conditions.

As illustrated in FIG. 5A, under a first condition, the gate voltage Vg is set to 4 V, the drain voltage Vd is set to 4 V, the source voltage Vs is set to 0 V, and the substrate voltage Vb is set to 0 V (Vg/Vd/Vs/Vb=4/4/0/0 (V)). On the other hand, as illustrated in FIG. 5B, under a second condition, the gate voltage Vg is set to 3 V, the drain voltage Vd is set to 3 V, the source voltage Vs is set to 0 V, and the substrate voltage Vb is set to −3 V (Vg/Vd/Vs/Vb=3/3/0/−3 (V)). In each conditions, a programming time is set to 10 μs. In addition, as illustrated in FIG. 5C, at the time of the reading, the sweep of the gate voltage Vg is made, the drain voltage Vd is set to 0 V, the source voltage Vs is set to 0.5 V, and the substrate voltage Vb is set to 0 V. The Id-Vg characteristic was measured before and after the programming (write). FIG. 6 illustrates measured results of the Id-Vg characteristic.

As illustrated in FIG. 6, in a case in which the programming is performed under the second condition, the drain current Id decreased considerably when compared to a case in which the programming is performed under the first condition. This indicates that an amount of change in a predetermined threshold voltage can be obtained within a shorter time by programming under the second condition. In other words, according to the second condition, the programming can be performed at a higher speed when compared to the programming performed under the first condition.

Figure 7:
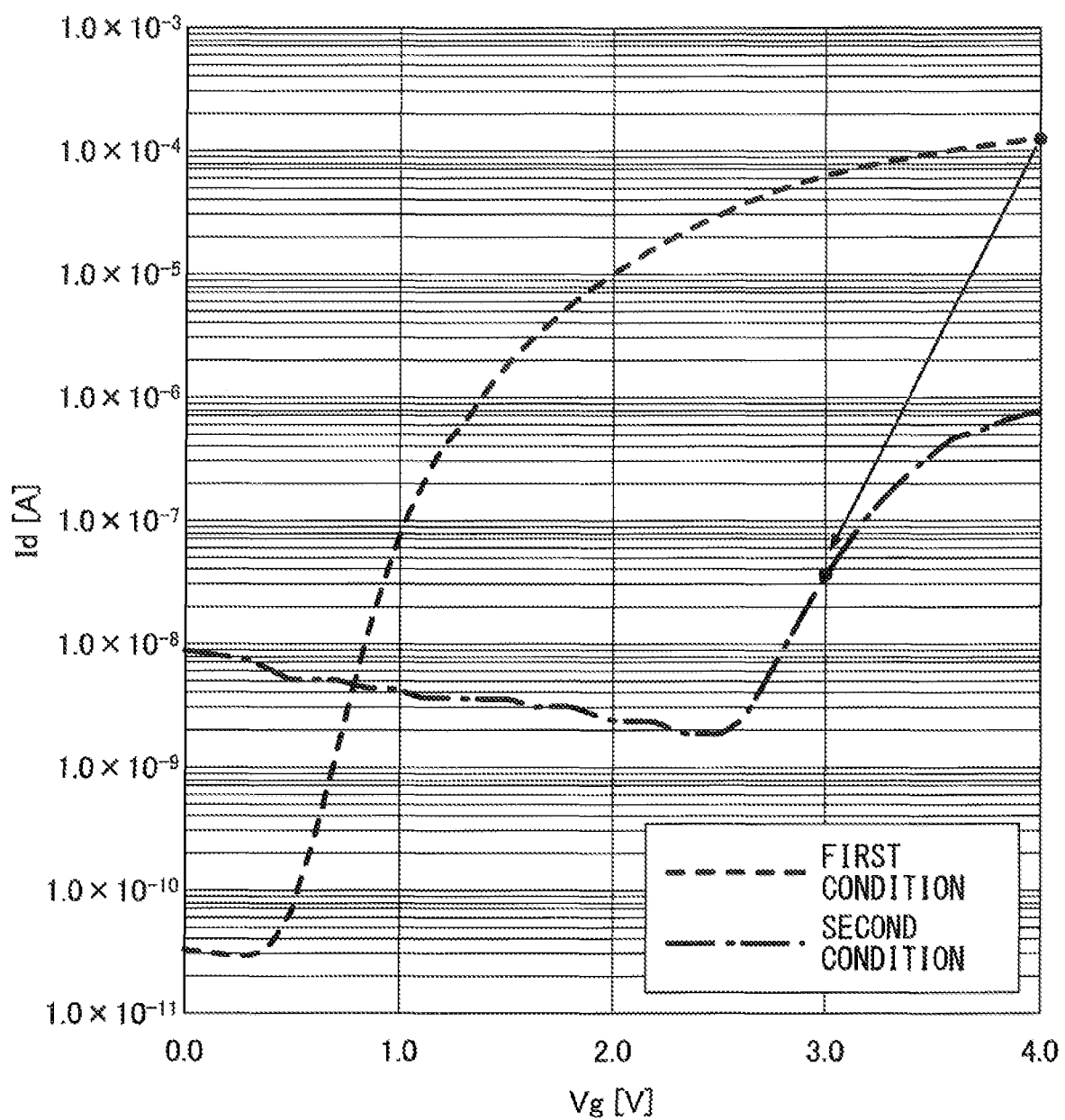
FIG. 7 is a diagram illustrating the Id-Vg characteristic of the pseudo memory transistor related to the first and second conditions.

Further, the Id-Vg characteristic was measured under the first condition and the second condition for the pseudo memory transistor 10a. FIG. 7 illustrates measured results of the Id-Vg characteristic.

As illustrated in FIG. 7, the programming current under the first condition is 0.1 mA or greater, while the programming current under the second condition is 0.1 μA or smaller which is 1/1000 times the programming current under the first condition or less. This indicates that, under a condition in which a programming time is constant, the programming current under the second condition can be decreased considerably compared to the programming current under the first condition. This tendency of the programming current can also be obtained in the memory transistor 10.

Accordingly, in a case in which an amount of change in the threshold voltage (ΔVth) due to the programming is determined in advance, the second condition can perform the programming in a shorter time with a smaller programming current compared to the first condition, and the power consumption can be greatly reduced compared to the first condition. Through the experiments conducted by the present inventors, it was confirmed that, in the memory transistor 10 having the third semiconductor region 112, the programming speed can be improved and the programming current can be decreased by performing the programming while applying the negative voltage to the semiconductor substrate 101. The programming speed is improved by applying the negative voltage to the semiconductor substrate 101, because a potential difference between the drain region 115d and the semiconductor substrate 101 increases and the generation of the hot electrons increases.

Figure 8A:
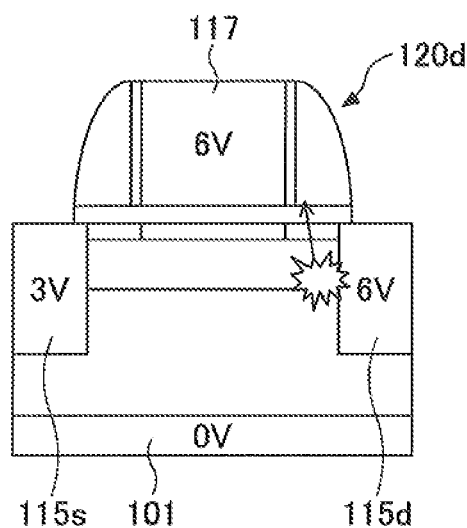
FIG. 8A, FIG. 8B, and FIG. 8C are diagrams illustrating other voltage conditions of the programming operation.
Figure 8B:
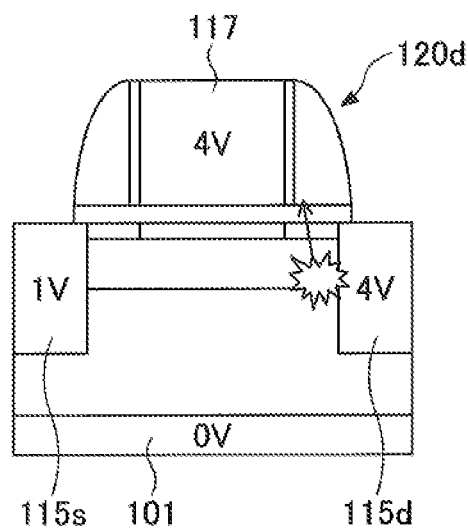
Figure 8C:
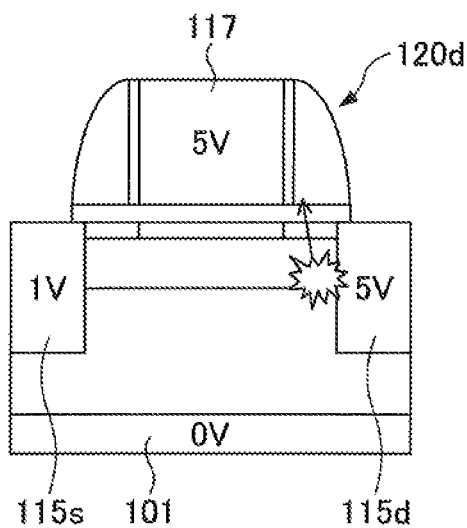
Figure 9:
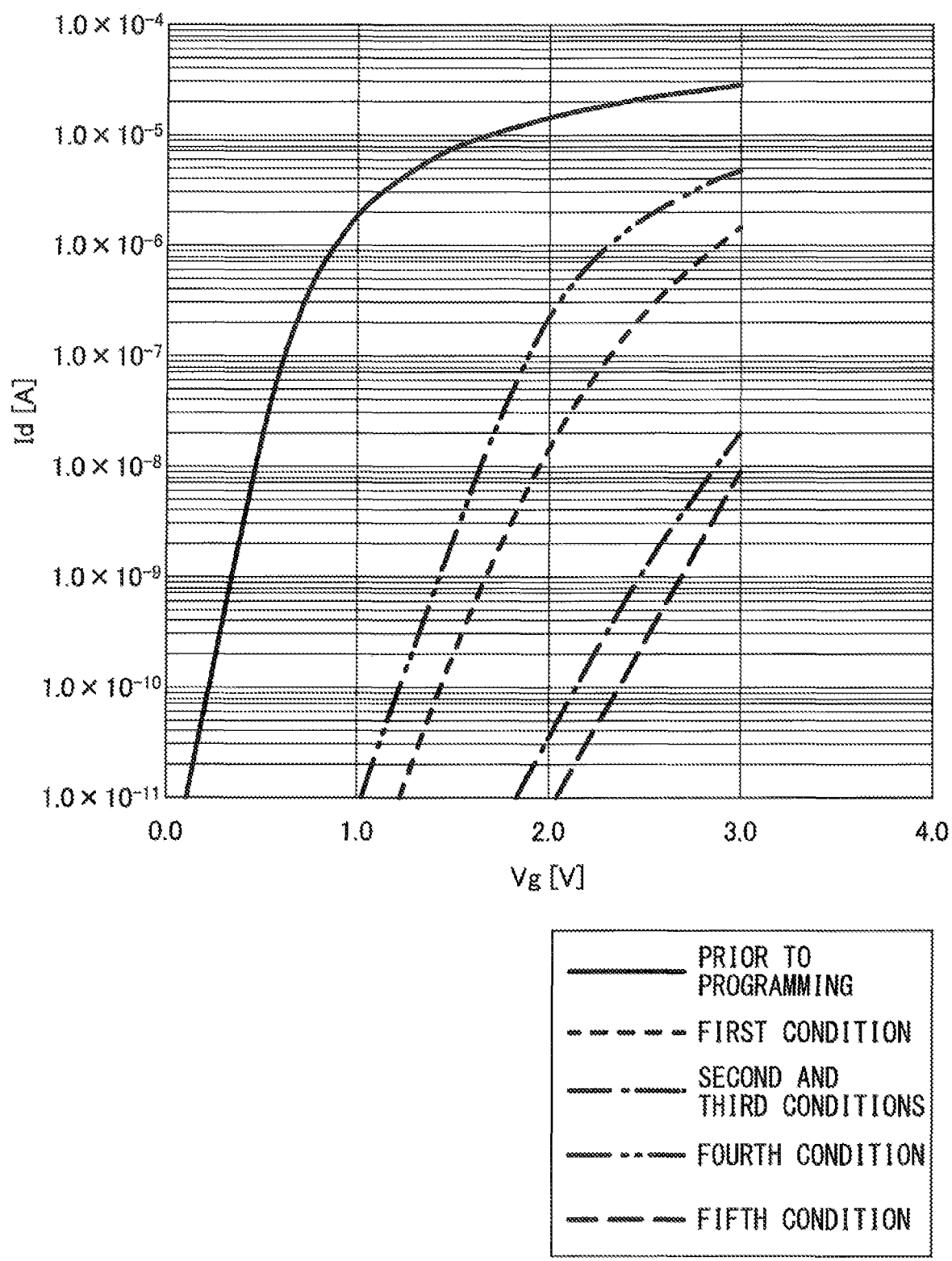
FIG. 9 is a diagram illustrating the Id-Vg characteristic before and after programming by the first through fifth conditions.

However, in order to apply the negative voltage to the semiconductor substrate 101 as in the case of the second condition, a negative voltage pump is required, and an operation of this negative voltage pump may cause the power consumption to increase. In addition, when an abnormally large current flows in the semiconductor substrate 101 due to a defect or the like, a capability of the negative voltage pump may be exceed and the substrate voltage Vb may assume a floating state, to cause a snapback. Hence, as a third condition equivalent to the second condition, it is conceivable to ground the semiconductor substrate 101, set the gate voltage Vg to 6 V, the drain voltage Vd to 6 V, and the source voltage Vs to 3 V (Vg/Vd/Vs/Vb=6/6/3/0 (V)). In addition, a fourth condition that lowers the gate voltage Vg, the drain voltage Vd, and the source voltage Vs more than the third condition is also conceivable. The fourth condition grounds the semiconductor substrate 101, and sets the gate voltage Vg to 4 V, the drain voltage Vd to 4 V, and the source voltage Vs to 1 V (Vg/Vd/Vs/Vb=4/4/1/0 (V)). Further, as a fifth condition, it is also conceivable to ground the semiconductor substrate 101, and set the gate voltage Vg to 5 V, the drain voltage Vd to 5 V, and the source voltage Vs to 1 V (Vg/Vd/Vs/Vb=5/5/1/0 (V)). FIG. 8A is a cross sectional view illustrating the third condition of the programming, FIG. 8B is a cross sectional view illustrating the fourth condition of the programming, and FIG. 8C is a cross sectional view illustrating the fifth condition of the programming. FIG. 9 illustrates the Id-Vg characteristic before and after the programming by the first through fifth conditions.

As illustrated in FIG. 9, according to the third condition, it is possible to obtain a Id-Vg characteristic similar to that obtainable according to the second condition. According to the fifth condition, the programming speed is higher than the first and third conditions. On the other hand, according to the fourth condition, the programming speed is lower than the first through third conditions. However, even when the programming speed is low, as long as the programming current is small, it is possible to reduce the power consumption required by the programming operation in order to obtain the amount of change ΔVth of the predetermined threshold voltage.

Figure 10:
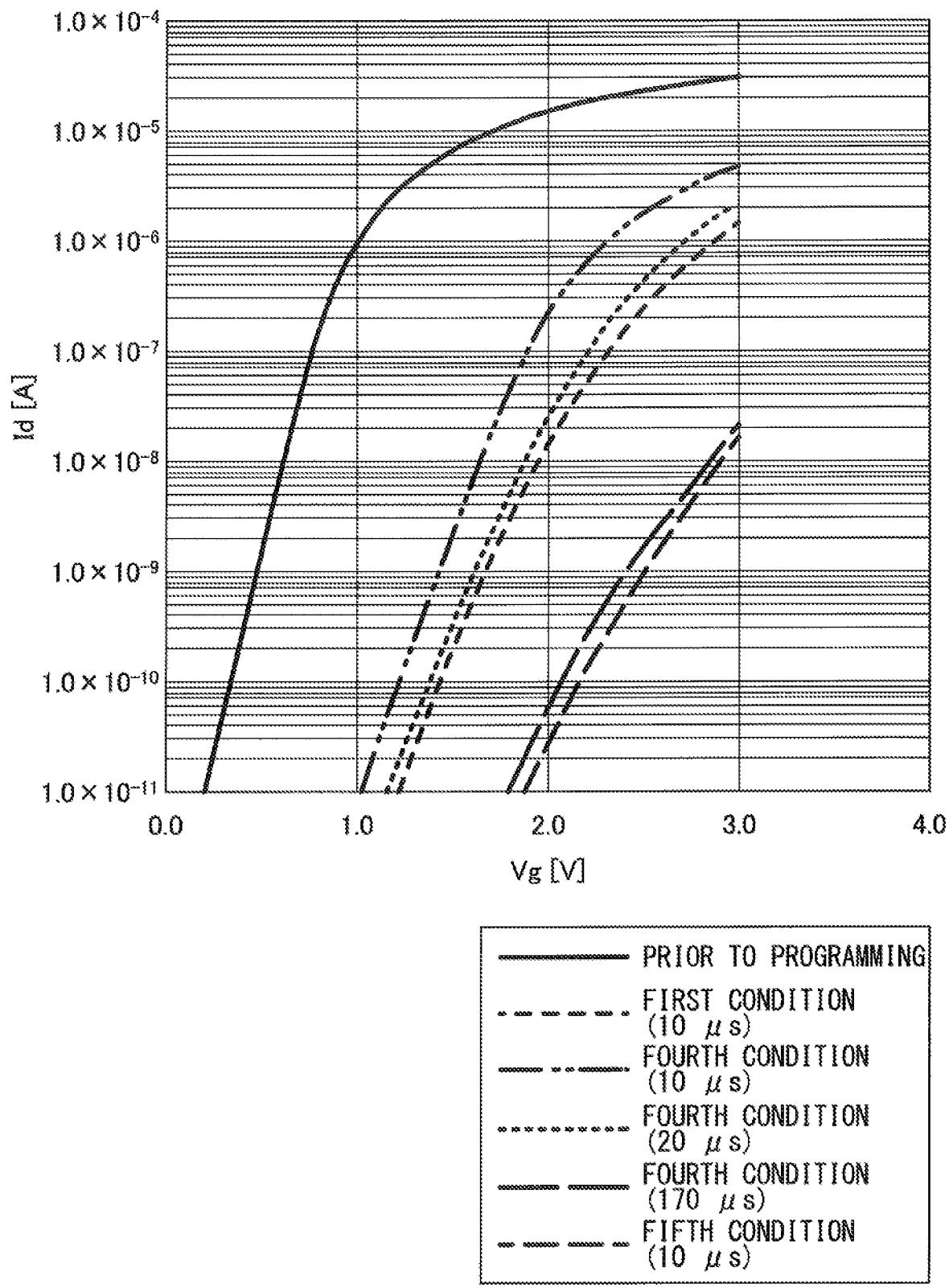
FIG. 10 is a diagram illustrating a relationship between a programming time and the Id-Vg characteristic.

Hence, the present inventors investigated a dependency of the fourth condition on the programming time. This investigation obtained a programming time with which an amount of decrease of the drain current Id is similar to that of the case in which the programming time is 10 μs under the first condition, and a programming time with which an amount of decrease of the drain current Id is similar to that of the case in which the programming time is 10 μs under the fifth condition. FIG. 10 illustrates results of the above investigation.

As illustrated in FIG. 10, in a case in which the programming time is 20 μs under the fourth condition, it is possible to obtain an amount of decrease of the drain current Id similar to that of the case in which the programming time is 10 μs under the first condition. In addition, in a case in which the programming time is 170 μs under the fourth condition, it is possible to obtain an amount of decrease of the drain current Id similar to that of the case in which the programming time is 10 μs under the fifth condition.

Figure 11:
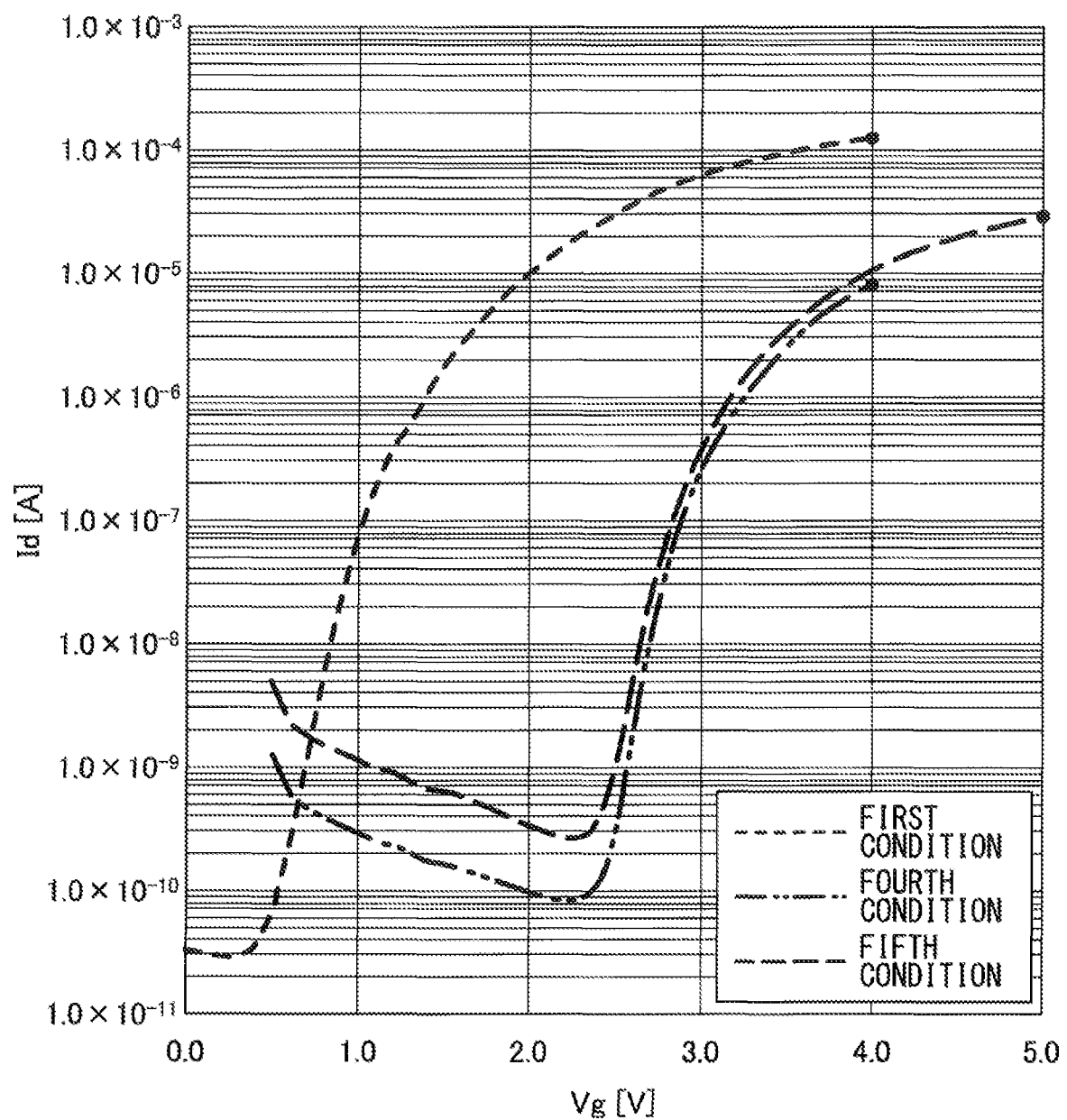
FIG. 11 is a diagram illustrating the Id-Vg characteristic of the pseudo memory transistor related to the first, fourth, and fifth conditions.

The present inventors investigated the Id-Vg characteristic for the first condition, the fourth condition, and the fifth condition. FIG. 11 illustrates results of the above investigation. As illustrated in FIG. 11, the programming current under the first condition is 120 μA, the programming current under the fourth condition is 9 μA, and the programming current under the fifth condition is 30 μA.

The following Table 1 illustrates the power consumption under the first condition, the fourth condition, and the fifth condition, measured by the experiment described above. In Table 1, Tp denotes the programming time, Vg denotes the gate voltage, Vd denotes the drain voltage, Vs denotes the source voltage, Vb denotes the substrate voltage, Ip denotes the programming current, and Pc denotes the power consumption.

TABLE 1

| Voltage Condition | Tp (μs) | Vg (V) | Vd (V) | Vs (V) | Vb (V) | Ip (μA) | Pc (nJ) |
|---|---|---|---|---|---|---|---|
| First Condition | 10 | 4 | 4 | 0 | 0 | 120 | 4.8 |
| Fourth Condition | 10 | 4 | 4 | 1 | 0 | 9 | 0.4 |
| | 20 | 4 | 4 | 1 | 0 | 9 | 0.7 |
| | 170 | 4 | 4 | 1 | 0 | 9 | 6.1 |
| Fifth Condition | 10 | 5 | 5 | 1 | 0 | 30 | 1.5 |

As illustrated in Table 1, in the case in which the programming is performed for the programming time Tp of 10 μs under the fourth condition, the power consumption Pc is reduced to approximately 1/12 that for the case in which the programming is performed for the programming time Tp of 10 μs under the first condition. The amount of change ΔVth of the threshold voltage Vth for the case in which the programming is performed for the programming time Tp of 10 μs under the fourth condition is smaller than the amount of change ΔVth of the threshold voltage Vth for the case in which the programming is performed for the programming time Tp of 10 μs under the first condition. However, the amount of change ΔVth of the threshold voltage Vth for the case in which the programming is performed for the programming time Tp of 20 μs under the fourth condition becomes approximately the same as the amount of change ΔVth of the threshold voltage Vth for the case in which the programming is performed for the programming time Tp of 10 μs under the first condition. Further, even in the case in which the programming is performed for the programming time Tp of 20 μs under the fourth condition, the power consumption Pc is 0.7 nJ and extremely low.

In the case in which the programming is performed for the programming time Tp of 10 μs under the fifth condition, the power consumption Pc becomes 1.5 nJ, however, an extremely large amount of change ΔVth of the threshold voltage Vth can be obtained. In other words, according to the fifth condition, the power consumption Pc can be made 1/3 that for the case in which the programming is performed under the first condition or less, and also obtain a programming speed that is extremely high. In the case in which the programming is performed for the programming time Tp of 170 μs under the fourth condition, the amount of change ΔVth of the threshold voltage Vth that is obtainable is approximately the same as that obtainable under the fifth condition, however, the programming time Tp under the fourth condition is long, thereby making the fifth condition more preferable than the fourth condition in this case.

As described above, at the time of the programming operation in the first embodiment, the semiconductor substrate 101 is grounded, the first voltage is applied to the gate electrode 117, the second voltage is applied to the drain region 115d, and the third voltage is applied to the source region 115s. The third voltage is lower than the first voltage and the second voltage. Accordingly, as is evident from the experiments described above, the first embodiment can greatly reduce the power consumption at the time of the programming operation by employing the voltage conditions described above.

The first voltage and the second voltage may be equal to each other, or may be different from each other. From a viewpoint of avoiding the circuit configuration from becoming complex, the first voltage and the second voltage are preferably equal to each other. In addition, the third voltage is not limited to 1 V, and may be 0.9 V, 0.3 V, or the like, for example.

Further, according to the third condition, the programming speed may improve, and the programming current may decrease, however, in order to generate the voltage of 6 V, the power consumption may increase. Accordingly, the gate voltage (first voltage) Vg and the drain voltage (second voltage) Vd are preferably set to 5 V or lower.

Figure 12:
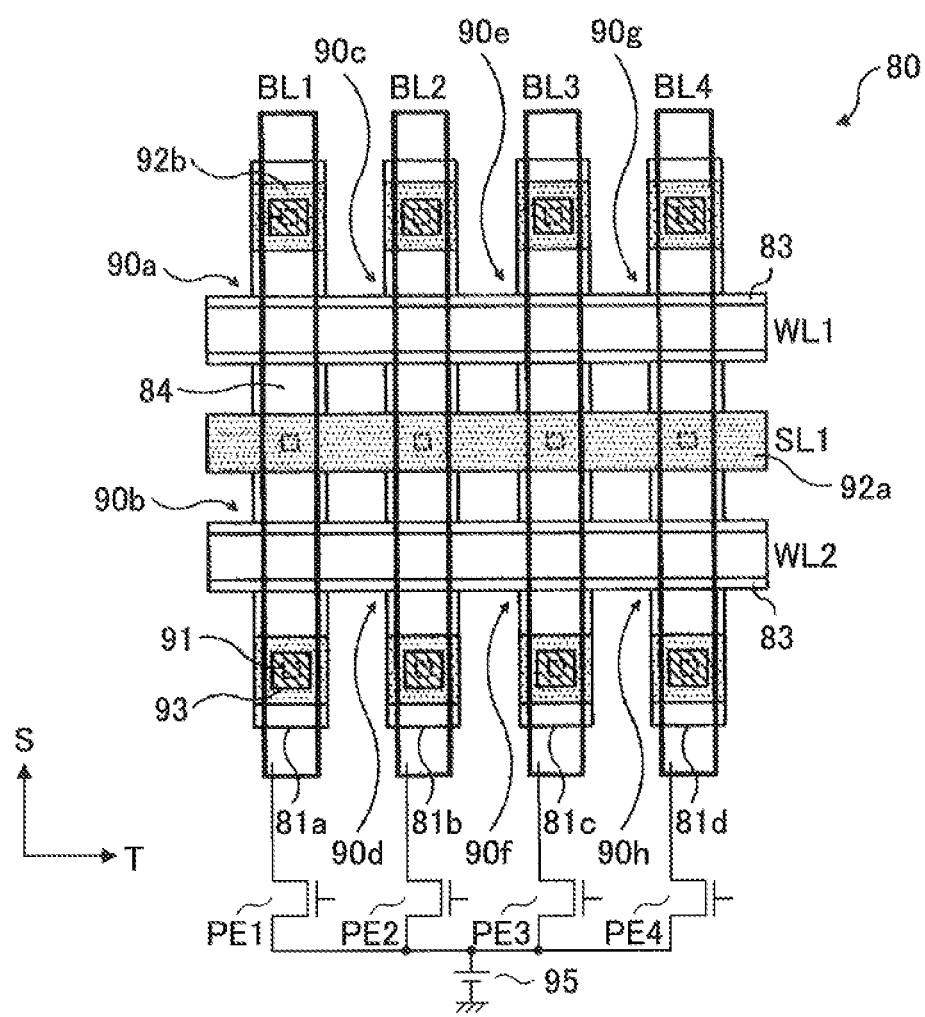
FIG. 12 is a diagram illustrating an example of a nonvolatile memory including a plurality of memory transistors.

Next, a nonvolatile memory including the plurality of memory transistors 10 will be described. FIG. 12 is a diagram illustrating an example of the nonvolatile memory including the plurality of memory transistors 10. FIG. 12 schematically illustrates a planar layout of a part of the example of the nonvolatile memory including the plurality of memory transistors 10.

As illustrated in FIG. 12, a nonvolatile memory (semiconductor device) 80 including the plurality of memory transistors 10, is provided with a plurality of (four in this example) active regions 81a, 81b, 81c, and 81d that are defined as element regions defined by element isolation regions (corresponding to the element isolation regions 102). The active regions 81a, 81b, 81c, and 81d extend along a direction S, and are arranged side by side in a direction T that is perpendicular to the direction S. Word lines WL1 and WL2 (corresponding to the gate electrode 117) extend in the direction T and traverse the active regions 81a, 81b, 81c, and 81d, via a gate insulator layer (corresponding to the gate insulator layer 116). Sidewall insulator layers 83 (corresponding to the sidewall insulator layers 120s and 120d) are formed on sidewalls of the word lines WL1 and WL2. Impurity regions 84 (corresponding to the source region 115s and the drain region 115d) that respectively function as a source region and a drain region are formed on each of the active regions 81a, 81b, 81c, and 81d on both sides of each of the word lines WL1 and WL2. A first semiconductor region (corresponding to the first semiconductor region 114s) and a second semiconductor region (corresponding to the second semiconductor region 114d) are formed below the sidewall insulator layers 83, on inner sides of the two impurity regions 84, respectively. A channel region (corresponding to the channel region 113) is formed between the first semiconductor region and the second semiconductor region. In addition, an impurity region (corresponding to the third semiconductor region 112) that becomes the SCR layer is formed below the channel region. The nonvolatile memory 80 includes a plurality of (eight in this example) memory transistors 90a, 90b, 90c, 90d, 90e, 90f, 90g, and 90h (corresponding to the memory transistors 10) that are formed by the elements described above.

A plug (contact) 91 that extends toward upper layers is formed on each impurity region 84. Each impurity region 84 connects to a wiring 92a or 92b included in a conductor layer of a first layer of the nonvolatile memory 80, via the plug 91.

The wiring 92a extends along the direction T. The wiring 92a is connected, via the plug 91, to the impurity region 84 that is shared by the memory transistors 90a and 90b in the active region 81a. The wiring 92a is connected, via the plug 91, to the impurity region 84 that is shared by the memory transistors 90c and 90d in the active region 81b. The wiring 92a is connected, via the plug 91, to the impurity region 84 that is shared by the memory transistors 90e and 90f in the active region 81c. The wiring 92a is connected, via the plug 91, to the impurity region 84 that is shared by the memory transistors 90*g* and 90*h* in the active region 81*d*. The wiring 92*a* is used as a source line (SL1).

The wiring 92*b* is connected, via the plug 91, to the impurity region 84 of each of the memory transistors 90*a*, 90*b*, 90*c*, 90*d*, 90*e*, 90*f*, 90*g*, and 90*h* provided at positions on the opposite side from the impurity region 84 that is connected to the source line SL1.

A via 93 that extends toward the upper layers is formed on each wiring 92*b*. The wiring 92*b* connected to the impurity region 84 of the memory transistors 90*a* and 90*b* in the active region 81*a* is connected, through the via 93, to a bit line BL1 extending in the direction S. The wiring 92*b* connected to the impurity region 84 of the memory transistors 90*c* and 90*d* in the active region 81*b* is connected, through the via 93, to a bit line BL2 extending in the direction S. The wiring 92*b* connected to the impurity region 84 of the memory transistors 90*e* and 90*f* in the active region 81*c* is connected, through the via 93, to a bit line BL3 extending in the direction S. The wiring 92*b* connected to the impurity region 84 of the memory transistors 90*g* and 90*h* in the active region 81*d* is connected, through the via 93, to a bit line BL4 extending in the direction S. The bit lines BL1, BL2, BL3, and BL4 are included in a conductor layer of a second layer of the nonvolatile memory 80. The bit lines BL1, BL2, BL3, and BL4 are respectively connected to first ends of switching transistors PE1, PE2, PE3, and PE4 that are respectively controlled by a programming enable signal. A voltage source 95 supplying the third voltage is connected to second ends of the switching transistors PE1, PE2, PE3, and PE4.

In the nonvolatile memory 80, each of the individual memory transistors 90*a*, 90*b*, 90*c*, 90*d*, 90*e*, 90*f*, 90*g*, and 90*h* functions as one memory cell. A description will be given of an example of the programming operation, the reading operation, and the erasing operation to program information, read information, and erase information, respectively, by referring to FIG. 13A through FIG. 15B. In this example, the nonvolatile memory 90 includes the memory transistors 90*a*, 90*b*, 90*c*, 90*d*, 90*e*, 90*f*, 90*g*, and 90*h* that are n-channel transistors.

Figure 13A:
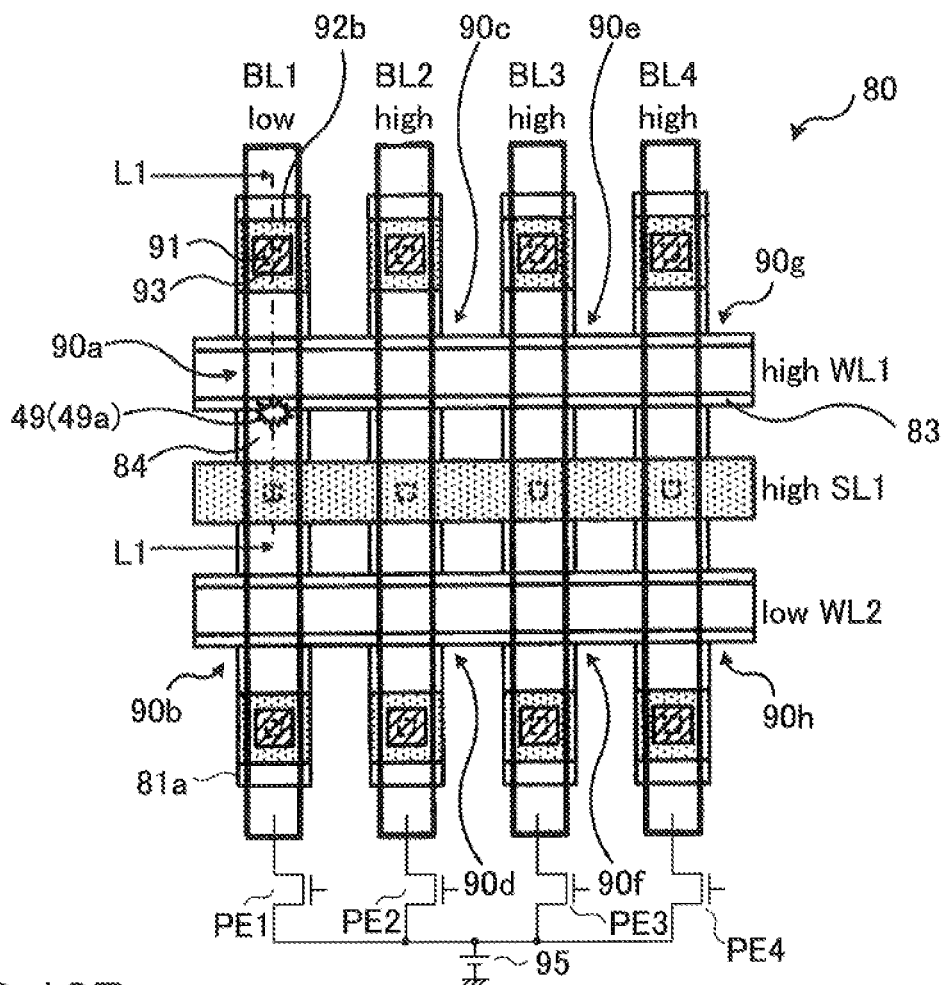
FIG. 13A and FIG. 13B are diagrams illustrating the programming operation of the nonvolatile memory including the plurality of memory transistors.
Figure 13B:
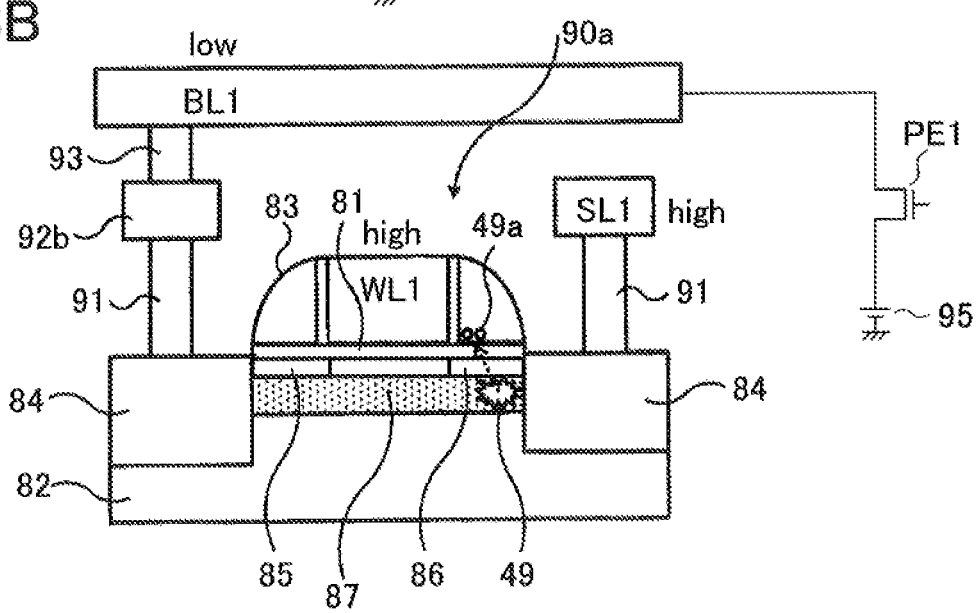

FIG. 13A and FIG. 13B are diagrams illustrating the programming operation of the nonvolatile memory 80. FIG. 13A schematically illustrates a plan view of a part of the nonvolatile memory 80 at the time of the programming operation, and FIG. 13B schematically illustrates a cross section of the part of the nonvolatile memory 80 at the time of the programming operation. FIG. 13B schematically illustrates the cross section along a line L1-L1 in FIG. 13A.

For example, at the time of the programming operation with respect to the memory transistor (memory cell) 90*a*, the semiconductor substrate 82 (corresponding to the semiconductor substrate 101 and the well 111) is grounded, the word line WL1 on the gate insulator layer 81 is set to a high potential (first voltage), the bit line BL1 is set to a low potential (third voltage), and the source line SL1 is set to a high potential (second voltage). The non-selected word line WL2 is set to a low potential (0 V), and the non-selected bit lines BL2 through BL4 are set to high potentials (4 V to 5 V). Hence, hot electrons (hot carriers 49 and charges 49*a*) are injected into and accumulated in the sidewall insulator layer 83 (corresponding to the sidewall insulator layer 120*d*) provided at a position above a second semiconductor region 86 (corresponding to the second semiconductor region 114*d*) of the memory transistor 90*a*, to perform the programming of the information.

In a case in which the second semiconductor region 86 of the memory transistor 90*a* has an extremely low impurity concentration, an electric field of the second semiconductor region 86 is relatively small. On the other hand, the impurity region 84 adjacent on an outer side of the second semiconductor region 86 has a high impurity concentration, and the electric field rapidly becomes large at an end art of the impurity region 84. As a result, the hot electrons are efficiently generated in a vicinity of the impurity region (drain region) 84 on the side of the source line SL1, and the generated hot electrons are efficiently injected into the sidewall insulator layer 83 above the second semiconductor region 86. In addition, because the impurity concentration of a first semiconductor region 85 is higher than the impurity concentration of the second semiconductor region 86, it is possible to obtain a superior durability.

Figure 14A:
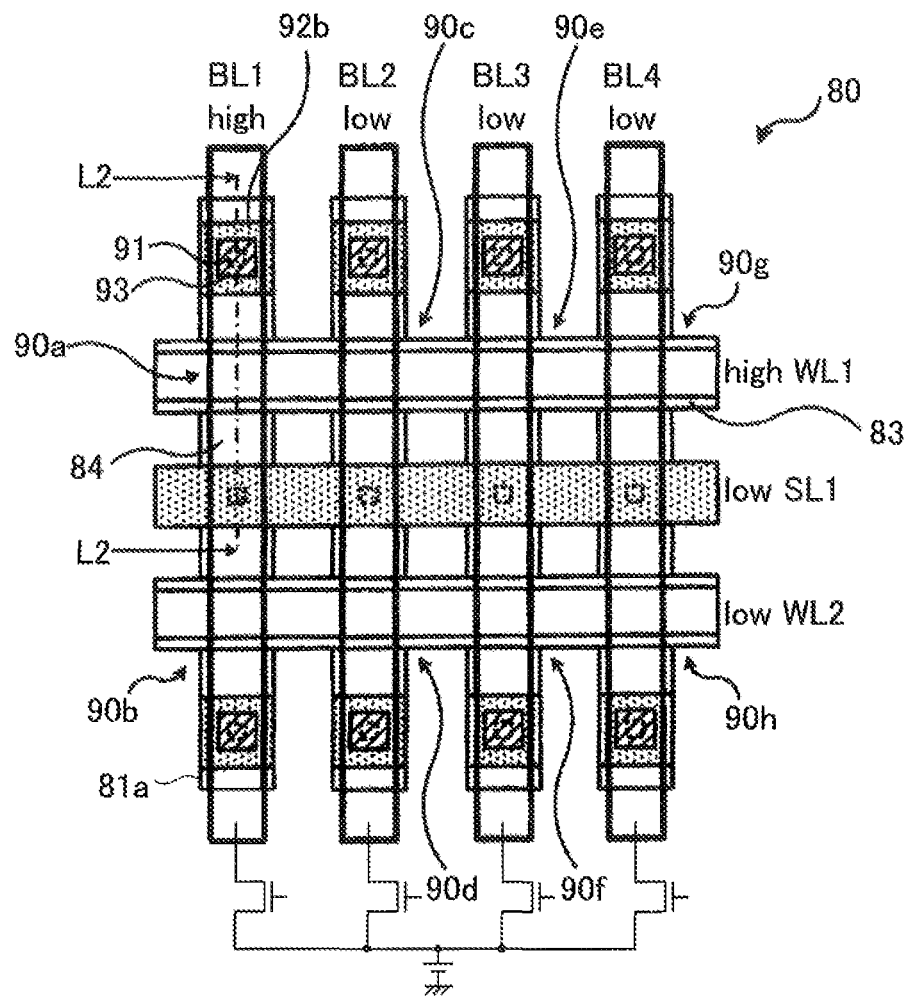
FIG. 14A and FIG. 14B are diagrams illustrating the reading operation of the nonvolatile memory including the plurality of memory transistors.
Figure 14B:
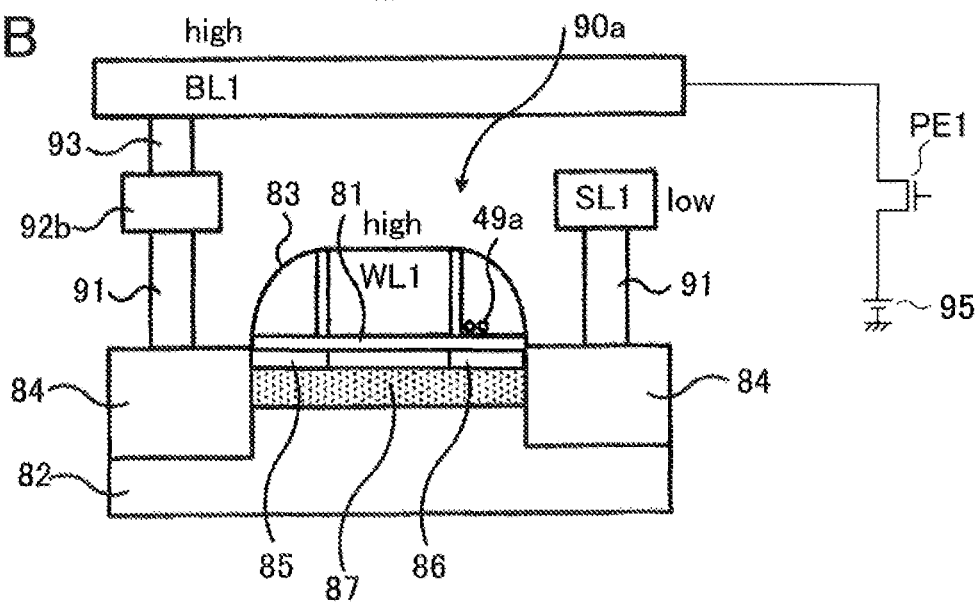

FIG. 14A and FIG. 14B are diagrams illustrating the reading operation of the nonvolatile memory 80. FIG. 14A schematically illustrates a plan view of a part of the nonvolatile memory 80 at the time of the reading operation, and FIG. 14B schematically illustrates a cross section of the part of the nonvolatile memory 80 at the time of the reading operation. FIG. 14B schematically illustrates the cross section along a line L2-L2 in FIG. 14A.

For example, at the time of the reading operation with respect to the memory transistor 90*a*, the word line WL1 is set to a high potential (2.0 V), the bit line BL1 is set to a high potential (0.5 V), and the source line SL1 is set to a low potential (0 V). The non-selected word line WL2 is set to a low potential (0 V), and the non-selected bit lines BL2 through BL4 are set to a low potential (0 V). FIG. 14A and FIG. 14B illustrate, as an example, the memory transistor 90*a* to which the charges 49*a* are injected into and stored in the sidewall insulator layer 83. By detecting a current flowing from the bit line BL1 to the source line SL1 at the time when the potentials described above are set, the reading operation is performed to read the information from the memory transistor 90*a*.

Figure 15A:
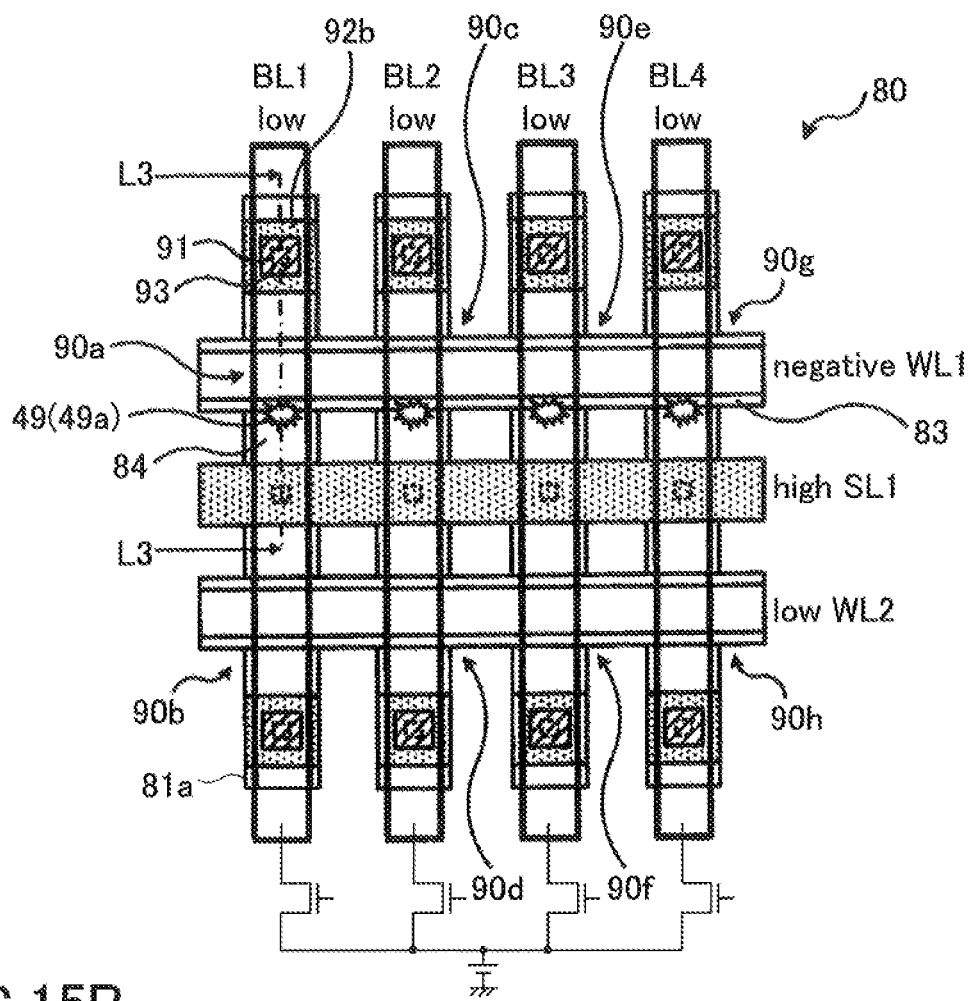
FIG. 15A and FIG. 15B are diagrams illustrating an erasing operation of the nonvolatile memory including the plurality of memory transistors.
Figure 15B:
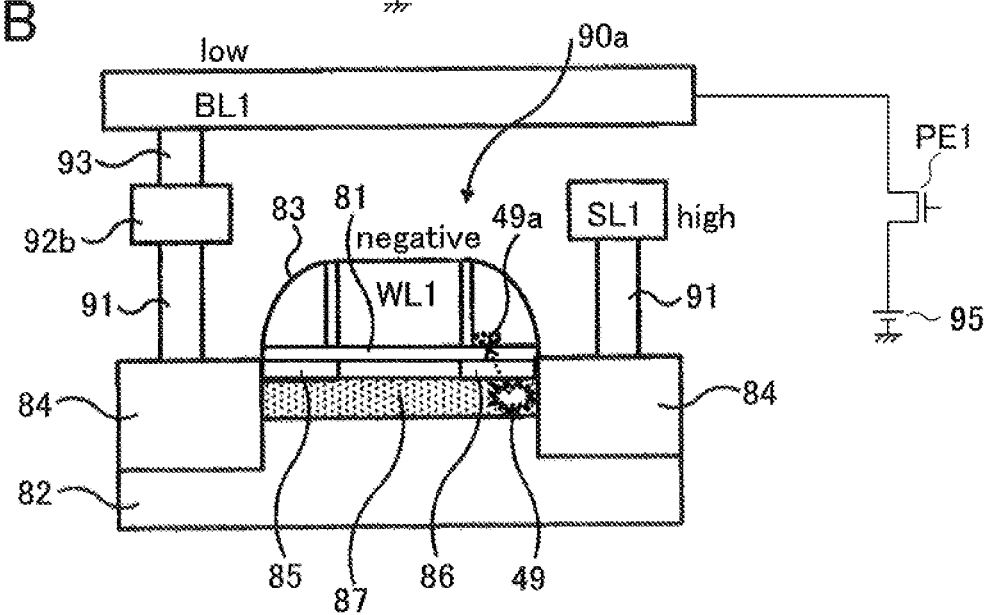

FIG. 15A and FIG. 15B are diagrams illustrating the erasing operation of the nonvolatile memory 80. FIG. 15A schematically illustrates a plan view of a part of the nonvolatile memory 80 at the time of the erasing operation, and FIG. 15B schematically illustrates a cross section of the part of the nonvolatile memory 80 at the time of the erasing operation. FIG. 15B schematically illustrates the cross section along a line L3-L3 in FIG. 15A.

For example, at the time of the erasing operation with respect to the memory transistor 90*a*, the programming operation described above is first performed with respect to the memory transistors 90*a*, 90*c*, 90*e*, and 90*g* that are connected to the word line WL1. After the memory transistors 90*a*, 90*c*, 90*e*, and 90*g* are put to the programmed state, the word line WL1 is set to a negative potential (−5 V to −6 V), the bit lines BL1 through BL4 are set to a low potential (0 V), and the source line SL1 is set to a high potential (4 V to 5 V). The non-selected word line WL2 is set to a low potential (0 V). Hence, the erasing operation is performed to erase the programmed information in the memory transistors 90*a*, 90*c*, 90*e*, and 90*g* that are connected to the word line WL1, including the memory transistor 90*a*.

At the time of the erasing operation, the hot holes (hot carriers 49) are generated in a vicinity of the impurity region 84 on the side of the source line SL1, to neutralize the electrons (charges 49*a*) accumulated in the sidewall insulator layer 83 provided at the position above the second semiconductor region 86. Because the hot holes are generated in the vicinity of the impurity region 84 on the side of the source line SL1, it is possible to reduce the effects of a region separated from the impurity region 84 on the threshold voltage. Accordingly, unless a gate length Lg of the word line WL1 is set excessively short, the threshold voltage as a whole becomes a positive voltage, that is, an off-current of the memory transistor 90a will not greatly exceed an initial value.

Second Embodiment

Figure 16:
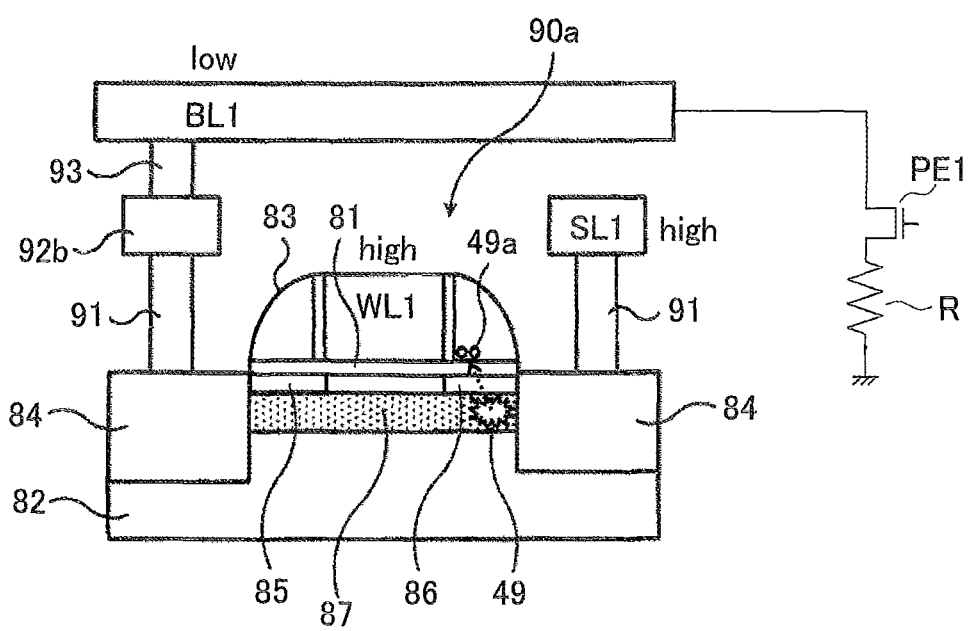
FIG. 16 is a diagram illustrating a part of a semiconductor device in a second embodiment.

Next, a second embodiment will be described. The semiconductor device in the second embodiment includes a resistor element connected between the switching transistor and the ground, in place of the voltage source of the third voltage. Otherwise, the semiconductor device has a structure similar to that of the first embodiment. FIG. 16 is a diagram illustrating a part of the semiconductor device in the second embodiment. FIG. 16 illustrates a part corresponding to FIG. 13B.

As illustrated in FIG. 16, a resistor element R is connected between the switching transistor PE1 and the ground, in place of the voltage source 95. When the programming current flows to the memory transistor 90a in the second embodiment having this structure, a voltage drop occurs at the resistor element R, and the source voltage rises by an amount corresponding to the voltage drop. For example, when a resistance of the resistor element R is 30 kΩ, the programming current of 30 µA flows, and the source voltage becomes 0.9 V. In addition, in a case in which the source voltage of 0.3 V is to be obtained, the resistance of the resistor element R may be 10 kΩ. Further, when performing the programming with respect to N (N is an integer greater than or equal to 2) bit lines in one operation, a sum total of the programming currents becomes N times that for the case in which the programming is performed with respect to a single bit line, and thus, the resistance of the resistor element R can be reduced to 1/N that for the case in which the programming is performed with respect to the single bit line.

According to the second embodiment, the third voltage can be obtained without using the voltage source 95. For example, the resistor element R can be formed using polycrystalline silicon (polysilicon). The resistor element R may be formed by a transistor having a sufficient parasitic resistance.

Third Embodiment

Figure 17:
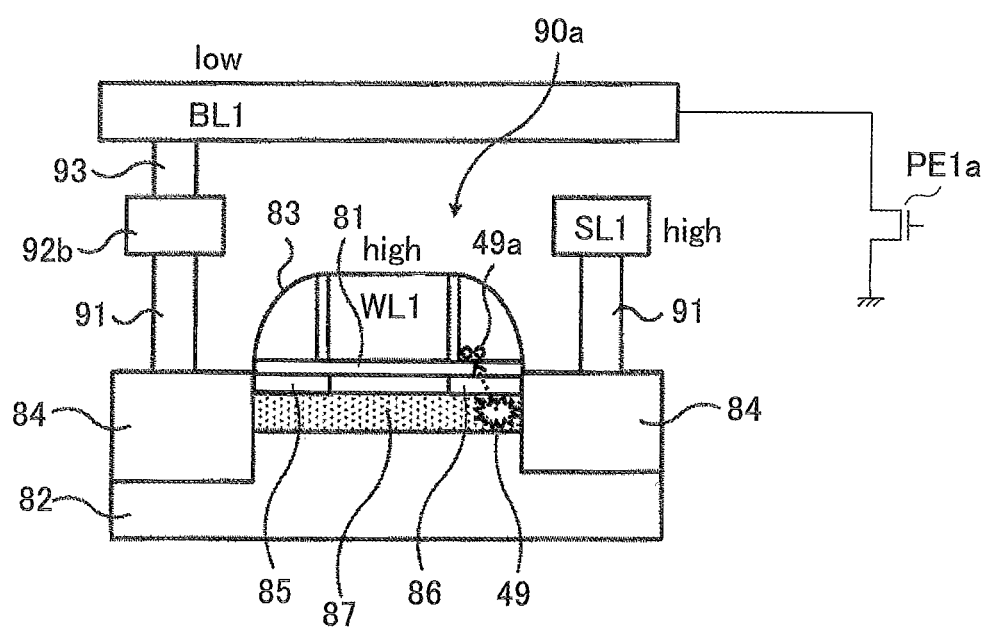
FIG. 17 is a diagram illustrating a part of the semiconductor device in a third embodiment.

Next, a third embodiment will be described. The semiconductor device in the third embodiment includes a switching transistor is relatively a higher parasitic resistance, an end of the switching transistor is connected to a ground. Otherwise, the semiconductor device has a structure similar to that of the first embodiment. FIG. 17 is a diagram illustrating a part of the semiconductor device in the third embodiment. FIG. 17 illustrates a part corresponding to FIG. 13B.

As illustrated in FIG. 17, a switching transistor PE1a is connected between the bit line BL1 and the ground, in place of the switching transistor PE1. The switching transistor PE1a has a parasitic resistance higher than that of the switching transistor PE1, and has an on-resistance that is adjustable.

According to the third embodiment, when the programming current flows to the memory transistor 90a, a voltage drop occurs at the switching transistor PE1a, and the source voltage rises by an amount corresponding to the voltage drop. In other words, the switching transistor PE1a includes the functions of the switching transistor PE1 and the resistor element R.

Figure 18:
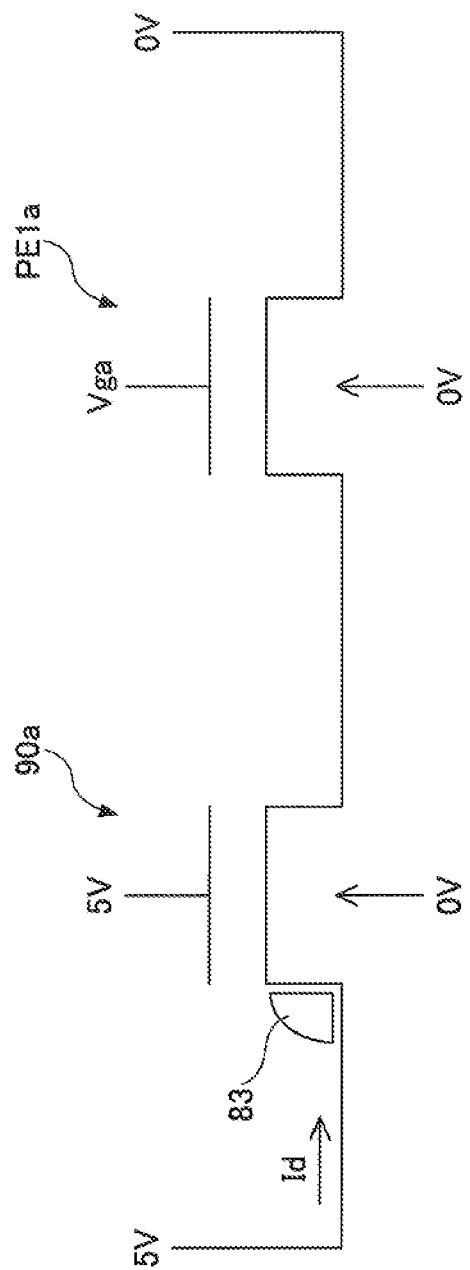
FIG. 18 is a diagram illustrating a circuit including a memory transistor and a switching transistor.

A preferable range of the gate voltage of the switching transistor PE1a will be described. The present inventors prepared a circuit illustrated in FIG. 18, and measured characteristics of this circuit. In this circuit, a gate width and a gate length of the memory transistor 90a are 0.16 µm and 0.10 µm, respectively, and a gate width and a gate length of the switching transistor PE1a are 0.30 µm and 0.35 µm, respectively. A thickness of the gate oxide layer of the switching transistor PE1a is 7 nm. The gate voltage Vg and the drain voltage Vd of the memory transistor 90a are set to 5 V, similarly as in the case of the fifth condition described above.

Figure 19:
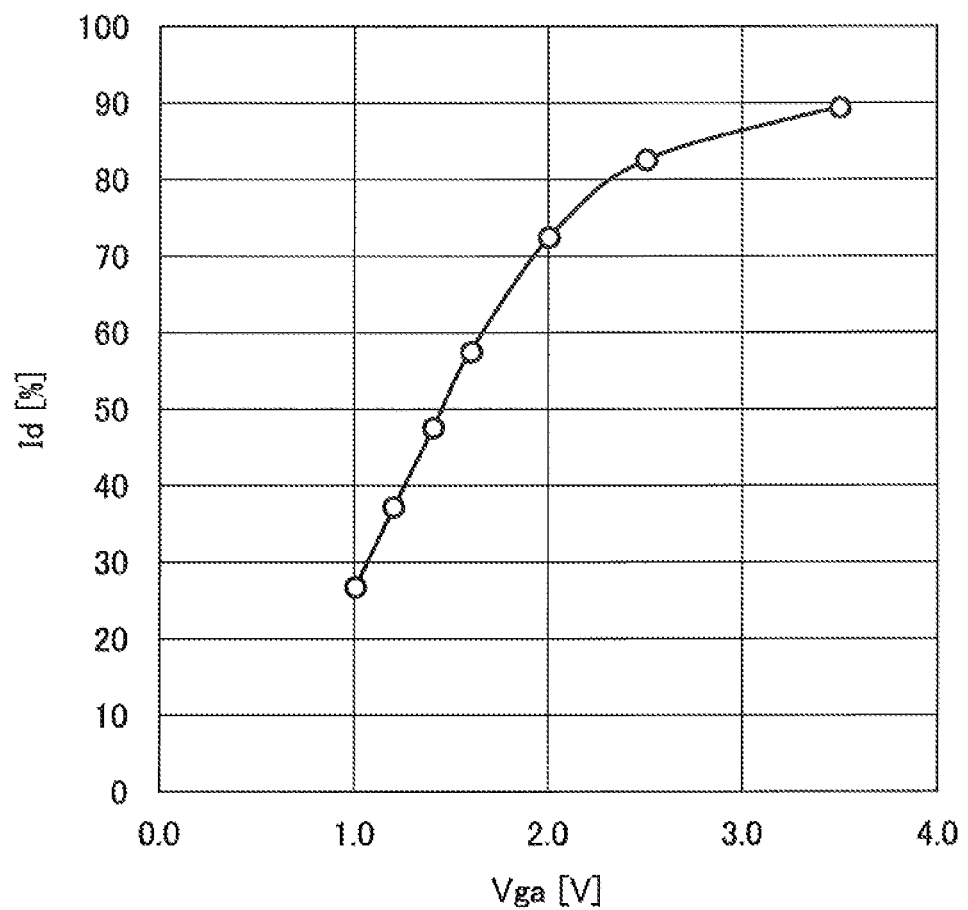
FIG. 19 is a diagram illustrating a relationship between a gate voltage of the switching transistor and a drain current of the memory transistor.

The drain current Id flowing to the memory transistor 90a was measured for a case in which a gate voltage Vga of the switching transistor PE1a is in a range of 1.0 V to 3.5 V. FIG. 19 illustrates results of the measurement. In FIG. 19, the ordinate indicates the drain current Id that is normalized, by regarding the drain current Id to be 100% for a case in which the switching transistor PE1a is not provided and the source of the memory transistor 90a is grounded. As illustrated in FIG. 19, when the higher the gate voltage Vga becomes, the larger the drain current Id becomes. From the results illustrated in FIG. 19, it may be regarded that the source voltage of the memory transistor 90a becomes approximately 1 V when the gate voltage Vga is approximately 1 V.

Figure 20:
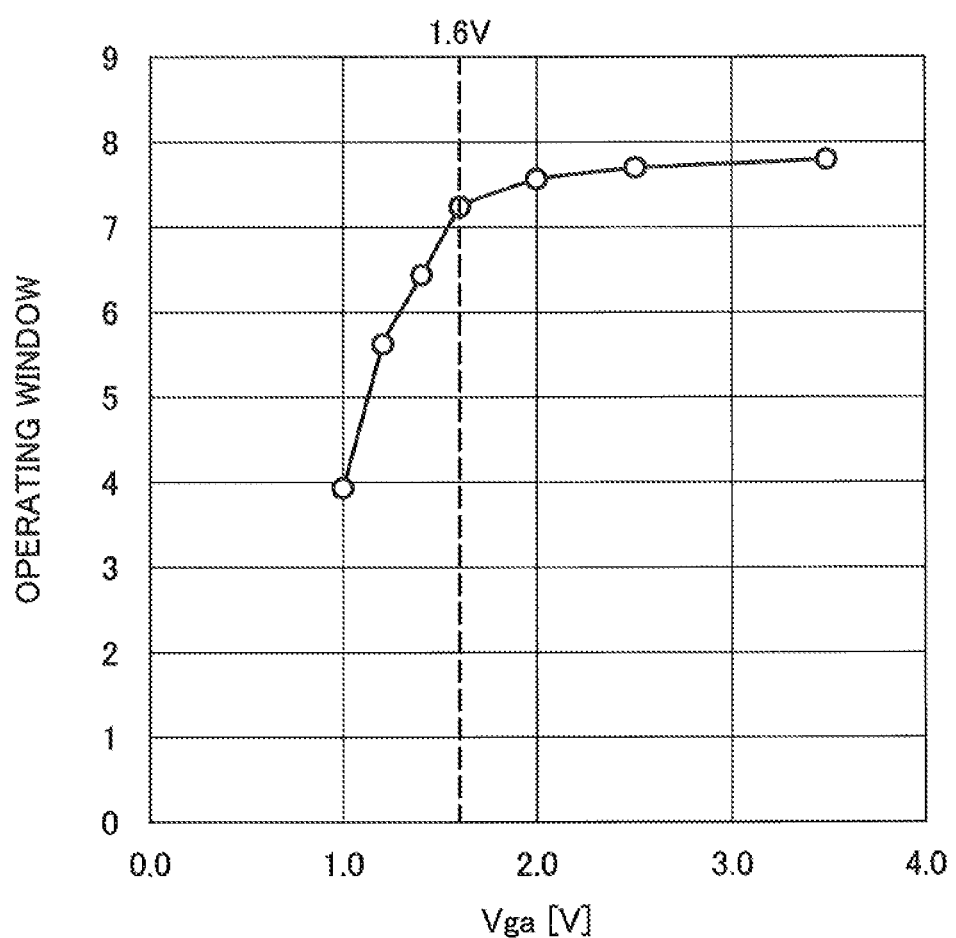
FIG. 20 is a diagram illustrating a relationship between the gate voltage of the switching transistor and an operating window of the memory transistor.

An operating window was measured for a case in which the programming operation and the erasing operation are performed 10000 times when the gate voltage Vga of the switching transistor PE1a is in a range of 1.0 V to 3.5 V. FIG. 20 illustrates results of the measurement. As illustrated in FIG. 20, the operating window becomes narrow when the gate voltage Vga is lower than 1.6 V.

From the results illustrated in FIG. 19 and FIG. 20, the gate voltage Vga is preferably 1.6 V or higher in a case in which the gate width, the gate length, and the thickness of the gate oxide layer of the switching transistor PE1a that is used are 0.30 µm, 0.35 µm, and 7 nm, respectively.

According to each of the embodiments describe above, it is possible to provide a semiconductor device that can further reduce the power consumption.

The description above use terms such as "determine", or the like to describe the embodiments, however, such terms are abstractions of the actual operations that are performed. Hence, the actual operations that correspond to such terms may vary depending on the implementation, as is obvious to those skilled in the art.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a gate insulator layer provided above a semiconductor substrate;

a gate electrode provided above the gate insulating layer;
a sidewall insulator layer provided on sidewalls of the gate electrode and above the semiconductor substrate;
a source region and a drain region respectively provided within the semiconductor substrate on both sides of the gate electrode, and including impurities of a first conductivity type;
a first semiconductor region provided within the semiconductor substrate at a position below a first part of the sidewall insulator layer closer to the source region than the gate electrode, and including impurities of the first conductivity type having an impurity concentration lower than that of the source region;
a second semiconductor region provided within the semiconductor substrate at a position below a second part of the sidewall insulator layer closer to the drain region than the gate electrode, and including impurities of the first conductivity type having an impurity concentration lower than that of the drain region;
a channel region provided within the semiconductor substrate between the first semiconductor region and the second semiconductor region; and
a third semiconductor region provided within the semiconductor substrate below the channel region, and including impurities of a second conductivity type different from the first conductivity type and having an impurity concentration higher than that of the channel region,
wherein the semiconductor device is configured to store information in response to receiving a charge injected into the sidewall insulator layer in a state where the semiconductor substrate is grounded, the gate electrode receives a first voltage higher than a ground potential, the drain region receives a second voltage higher than the ground potential, and the source region receives a third voltage higher than the ground potential and lower than the first voltage and the second voltage.

2. The semiconductor device as claimed in claim 1, wherein the first voltage and the second voltage are equal to each other.

3. The semiconductor device as claimed in claim 1, further comprising:
a resistor element coupled between the source region and ground.

4. The semiconductor device as claimed in claim 1, further comprising:
a transistor coupled between the source region and ground.

5. The semiconductor device as claimed in claim 1, wherein the third voltage is one of 0.3 V, 0.9 V, and 1 V.

6. The semiconductor device as claimed in claim 1, wherein the first voltage and the second voltage are 5 V or lower.

7. The semiconductor device as claimed in claim 1, wherein the first voltage is 1.6 V or higher.

8. The semiconductor device as claimed in claim 1, wherein an impurity concentration of the first conductivity type in the second semiconductor region is lower than an impurity concentration of the first conductivity type in the first semiconductor region.

9. The semiconductor device as claimed in claim 8, wherein the second semiconductor region is a non-doped region.

10. The semiconductor device as claimed in claim 3, wherein the resistor element is made of polysilicon.

11. The semiconductor device as claimed in claim 4, wherein the transistor is coupled to a plurality of memory transistors via a bit line that is shared by the plurality of memory transistors.

12. The semiconductor device as claimed in claim 4, further comprising:
a voltage source coupled between the transistor and the ground.

13. The semiconductor device as claimed in claim 3, wherein the resistor element is directly connected to the ground.

14. The semiconductor device as claimed in claim 4, wherein the transistor is directly connected to the ground.

* * * * *